United States Patent [19]

Lampe et al.

[11] Patent Number: 5,146,299
[45] Date of Patent: Sep. 8, 1992

[54] FERROELECTRIC THIN FILM MATERIAL, METHOD OF DEPOSITION, AND DEVICES USING SAME

[75] Inventors: Donald R. Lampe, Ellicott City, Md.; Samar Sinharoy, Monroeville, Pa.; Shu Y. Wu, Artesia, Calif.; Harry Buhay, Allison Park, Pa.; Maurice H. Francombe, Penn Hills, Pa.; S. Visvanathan Krishnaswamy, Monroeville, Pa.

[73] Assignee: Westinghouse Electric Corp., Pittsburgh, Pa.

[21] Appl. No.: 487,056

[22] Filed: Mar. 2, 1990

[51] Int. Cl.$^5$ .............. H01L 29/68; H01L 27/02; H01G 4/10
[52] U.S. Cl. .............................. 357/23.5; 357/51; 361/321 CC; 365/145
[58] Field of Search ............... 357/23.5, 51; 361/321 CC; 365/145

[56] References Cited

U.S. PATENT DOCUMENTS

| | | | |
|---|---|---|---|
| 3,710,352 | 1/1973 | Smith et al. | 340/173.2 |
| 3,774,174 | 11/1973 | Francombe et al. | 340/173.2 |
| 3,808,674 | 5/1974 | Francombe et al. | 29/590 |
| 3,832,700 | 8/1974 | Wu et al. | 340/173.2 |
| 4,161,038 | 7/1979 | Wu | 365/145 |
| 4,772,985 | 8/1988 | Yasumoto et al. | 361/321 |
| 4,860,254 | 8/1989 | Pott et al. | 357/40 |
| 4,888,630 | 12/1989 | Paterson | 357/23.5 |
| 4,897,374 | 1/1990 | Matsumoto et al. | 501/134 |

FOREIGN PATENT DOCUMENTS 62-185376 8/1987 Japan.
64-66899 3/1989 Japan.

OTHER PUBLICATIONS

Arnett, Ferroelectric FET Device, IBM Technical Disclosure Bulletin, vol. 15, No. 9, Feb. 1973, p. 2825.
Military Electronics, Jul. 17, 1989, "Nonvolatile Memory Advances Reduce Avionics Weight, Power Requirements."
Japanese Journal of Applied Physics, Apr. 1986, "A Metal-Insulator-Semiconductor (MIS) Device Using a Ferroelectric Polymer Thin Film in the Gate Insulator."
Science, vol. 246, Dec. 15, 1989, "Ferroelectric Memories."

*Primary Examiner*—Rolf Hille
*Assistant Examiner*—Robert P. Limanek
*Attorney, Agent, or Firm*—W. G. Sutcliff

[57] ABSTRACT

A ferroelectric device that comprises a polarizing thin film of $BaMF_4$ deposited on a substrate. Ba is barium, M is one of the metals of the group consisting of iron (FE), manganese (Mn), cobolt (Co), nickel (Ni), magnesium (Mg), and zinc (Zn). The substrate is silicon, sapphire, or gallium arsenide. A non-volatile NDRO and DRO memory cell and methods for depositing the thin film. A method of depositing bismuth titanate on a substrate are described.

41 Claims, 20 Drawing Sheets

100 nm

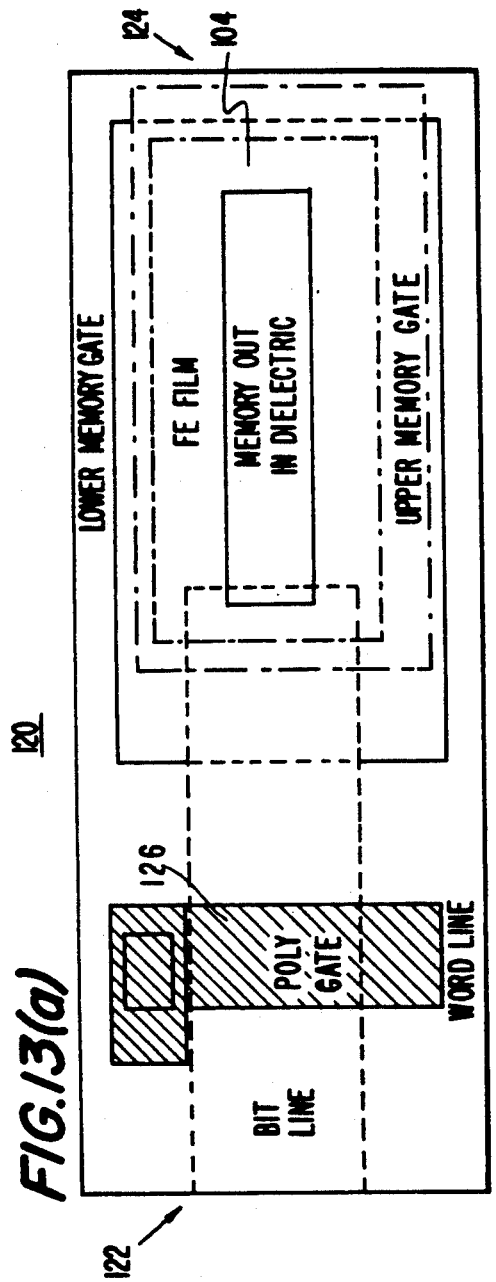
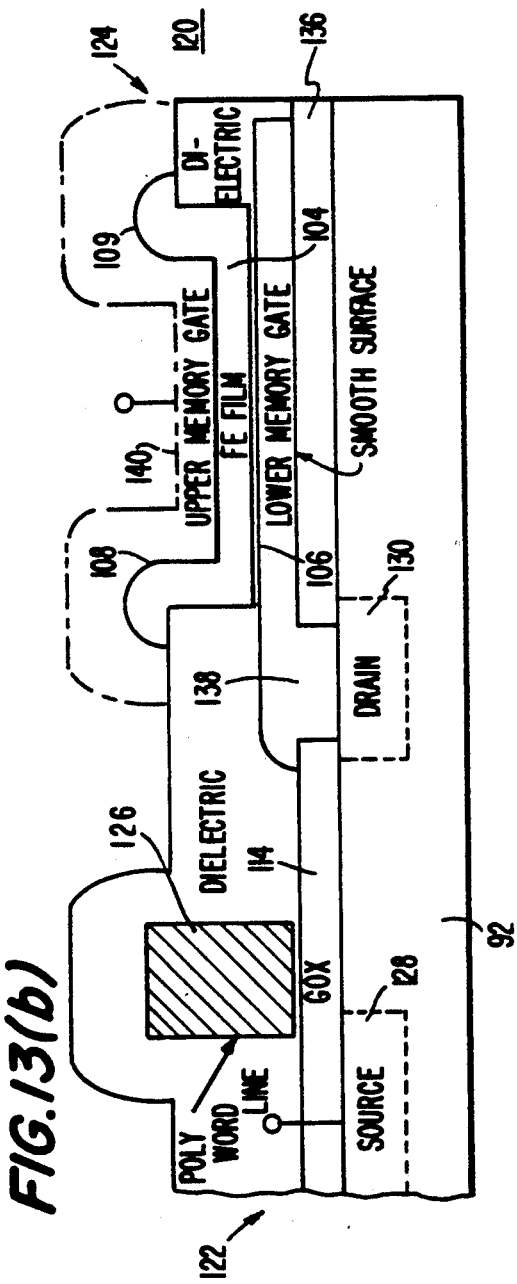
FIG.13(a)
FIG.13(b)

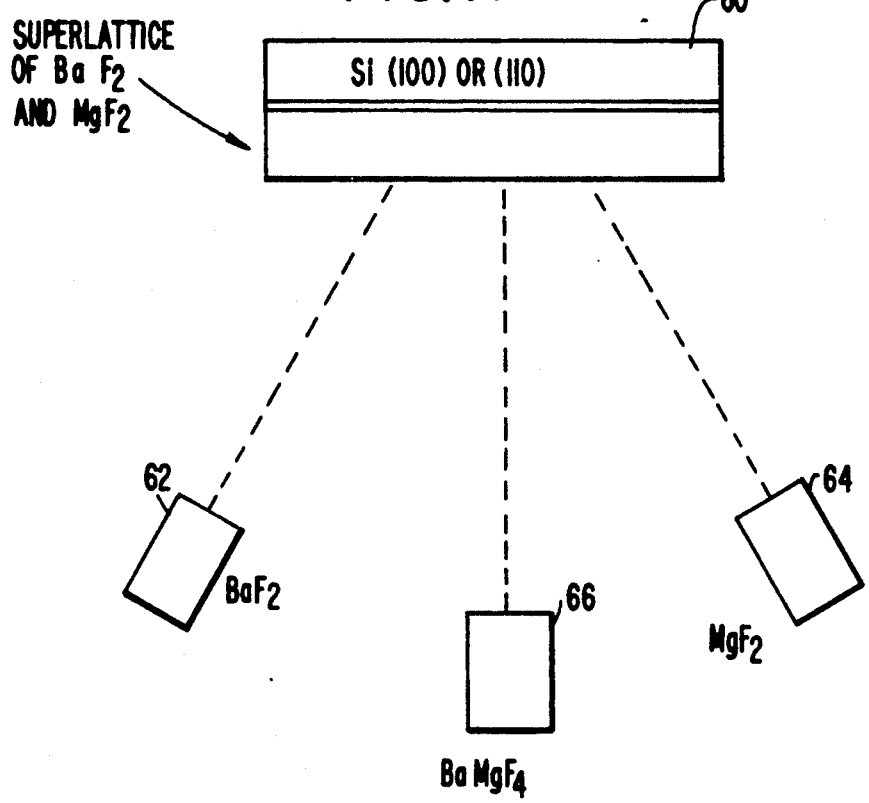
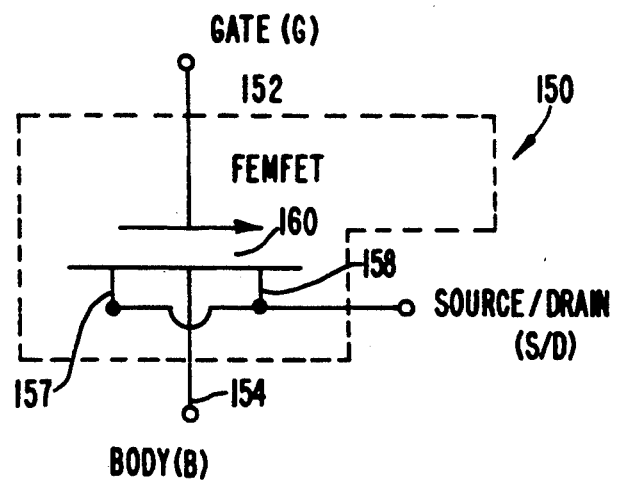

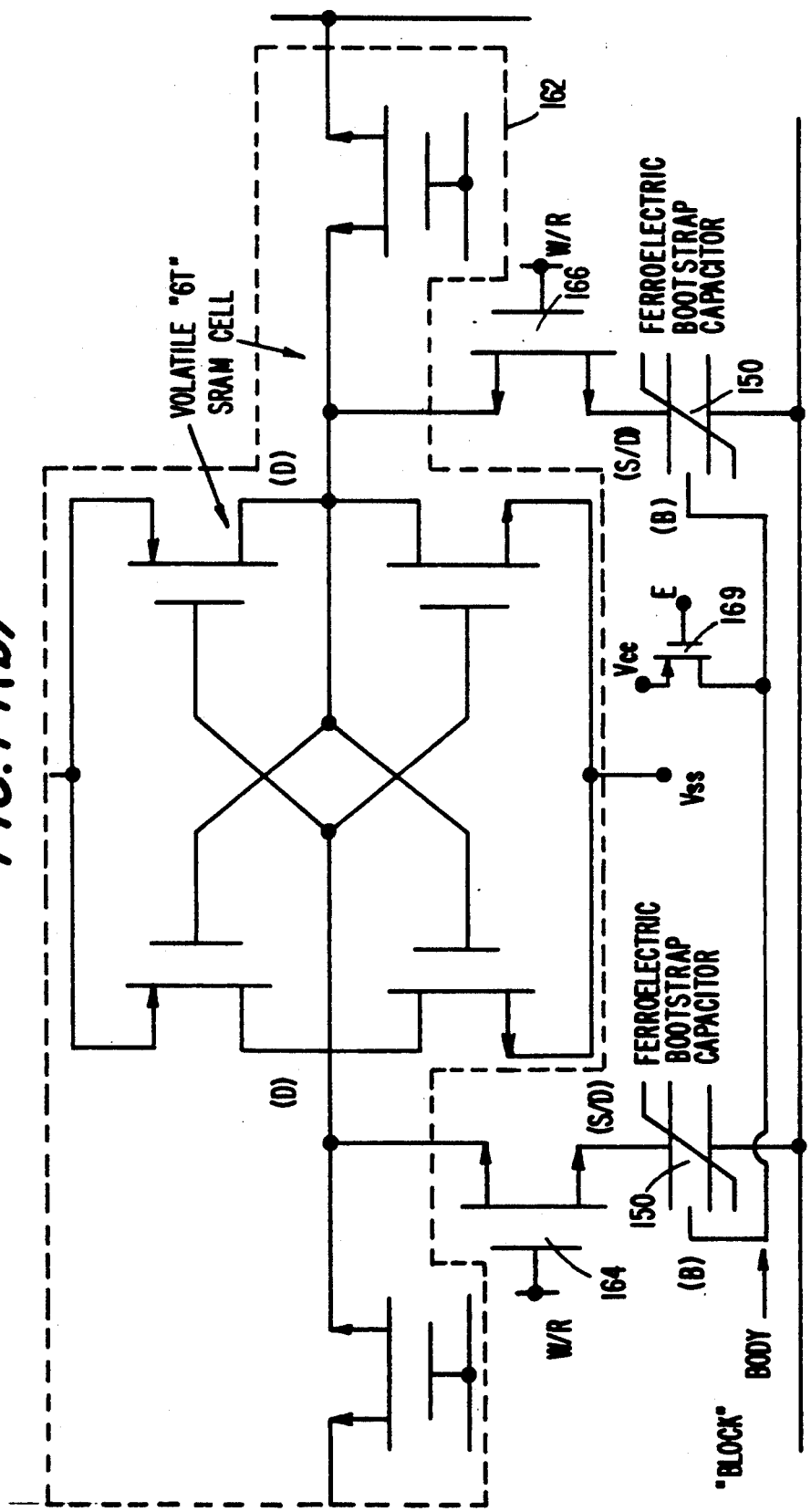

FERROELECTRIC THIN FILM MATERIAL, METHOD OF DEPOSITION, AND DEVICES USING SAME

BACKGROUND

1. Field of the Invention

The present invention relates to ferroelectric semiconductor devices; and more particularly, to a thin film material, method of deposition, and devices incorporating same. Although, the thin film material and method of deposition of the present invention is suitable for many destructive read-out (DRO) and nondestructive read-out (NDRO) applications, it is particularly advantageous for use in very large scale integrated circuits (VLSIC) having a ferroelectric storage medium on a semiconductor substrate, such as a ferroelectric (NDRO) field effect transistor (FEMFET) and a capacitive (DRO) memory, for example, and will be described in more detail in connection therewith.

2. Discussion of Related Art

Information processing and memory technologies remain one of the fastest growing and most rapidly changing areas in VLSIC. For example, future avionics systems will be required to process and transfer massive amounts of data from on-board and remote sensors at very high speeds. Many of the memory technologies now installed in field equipments or space vehicles are out of production and only available at a premium price. Core memories are used in tactical computers because of the need for non-volatility and radiation hardness. The slow access time and low packaging density of core memories impose limitations on speed and capacity in military computers. Meanwhile, increasingly high speed and capacity are required for the more sophisticated signal processing of modern systems. Plated wire memories are used in strategic missiles; and they are heavy, bulky, and consume a considerable amount of power. This adds to the propulsion requirements of the missile. Core and plated wire memories are old technologies that need replacement by a technology which incorporates decoding and amplification on the same chip. The ferroelectric RAM (FERRAM) is such an integrated memory, and it is fabricated using low-cost photolithographic techniques. A nonvolatile, NDRO, high density computer memory technology which can be radiation hard and which has both write (program) and access times on the order of 50 ns or less, with 5-volt programming is needed.

In order to meet these needs, thin films of ferroelectric materials have been proposed for memory applications. Among these proposals are the nonvolatile ferroelectric random access memory (RAM) chips using thin dielectric films, such as lead zirconium titanate (PZT) integrated memory structures involving $KNO_3$ thin film capacitors, and optically addressed memory arrays based upon thin films of composition $Pb_{0.92}Bi_{0.07}La_{0.01}(Fe_{0.405}Nb_{0.325}Zr^{0.27})O_3$, designated PZBFN-65. Among the more recent developments are the ferroelectric random access memory (RAM) chips using thin films of ceramic lead lanthanum zirconium titanate (PLZT).

A potentially important memory cell embodiment is the ferroelectric memory transistor (FEMFET), which utilizes a ferroelectric gate dielectric grown directly on a bulk semiconductor, such as silicon. Previous efforts demonstrated that structures of this type incorporating bismuth titanate films could be grown on silicon, and yielded devices exhibiting high speed and high retentivity. However, it appeared that conductivity modulation was dominated by the mechanism of carrier injection from the semiconductor into the $SiO_2$/ferroelectric interface traps, especially at low gate signal frequencies.

It is well known, that the ferroelectric properties of thin films grown on foreign substrates are strongly affected by defects, grain boundaries, and deviation from proper stoichiometry. The defects not only affect the ferroelectric behavior, but also the electronic properties. One common problem with the ferroelectric memory materials currently in use is that they suffer from fatigue (reduction of the magnitude of the remanant polarization after repeated cycling operations) and aging (decrease in the material polarization due to fewer domain realignments with constant poling fields) phenomena, thus making them unreliable for these applications. For memory applications, it is preferred that these films be grown on silicon or some other semiconductor substrate for integration with associated electronic circuits. In the fabrication of such devices processing temperatures, which are too high can have deleterious effects on previously deposited films. Also, low rates of deposition can make the devices costly to manufacture.

SUMMARY OF THE INVENTION

One of the objects of the present invention is to provide a non-volatile memory device having high speed, low power, and high retentivity performance; and does not exhibit fatigue or aging after repeated cycling operations.

Another object of the present invention is to provide a memory device having a highly oriented ferroelectric switchable charge storage structure suitable for large scale integrated circuits.

Another object of the present invention is to provide a thin film for semiconductor devices that possesses high quality ferroelectric properties at temperatures in the range of about $-55°$ C. to $150°$ C.

A further object of the present invention is to provide methods of preparing and depositing thin film material on a substrate at relatively low deposition temperatures and maintaining the ferroelectric characteristics of the in film.

A still further object of the present invention is to provide a thin film material that is a good insulator, has a close structural and lattice match to most semiconductors, and low vapor pressure ionic solids with high free energies of formation and disassociation.

Additional objects and advantages of the present invention will be set forth in part in the description which follows, and in part will be obvious from the description, or may be learned by practice of the invention. The objects and advantages may be realized and attained by means of the instrumentalities and combination particularly pointed out in the appended claims.

To achieve the objects and in accordance with the purpose of the invention, as embodied and broadly described herein, the present invention is a non-volatile memory device, comprises a semiconductor substrate having a thin film ferroelectric material that is composed of an isostructural group of fluorides $BaMF_4$ where M is either a divalent 3d transition metal ion, Mn, Fe, Co or Ni, or a nonmagnetic divalent ion, Mg or Zn.

In another aspect, the present invention comprises a non-volatile ferroelectric memory field effect transistor, comprising a substrate of one type of conductivity, spaced regions of the opposite type conductivity formed in a surface of the substrate, a thin film of a ferroelectric solid solution of divalent metal halides, spanning the space between said regions in intimate contact with the substrate surface, the ferroelectric thin film exhibiting hysteresis at temperatures in the range of approximately −55° C. to approximately, 150° C. when connected to an external circuit, and being processable at temperatures non-injurious to the substrate and spaced regions and without cross contamination between the film and substrate, and means for establishing a potential across the thin film from the substrate to effect spontaneous polarization of the thin film.

In a still further aspect of the present invention there is provided a method of growing thin films of ferroelectric fluoride material on a substrate, comprising cleaning the substrate; inserting the cleansed substrate into a growth chamber; heating the cleansed substrate to a temperature in the range of approximately 450° C.–500° C., flowing gas created from a selected volatile metal and fluorine source over the substrate in the growth chamber; and decomposing the flowing gas thermally for creating a reactive species effective to promote growth of the film to a selected thickness.

In a still further aspect of the present invention, there is provided a method of growing a highly oriented thin film of $BaMF_4$ on a substrate comprising providing a first molecular beam utilizing a $BaF_2$ source; providing a second molecular beam utilizing a $MF_2$ source where M is selected from the group consisting of manganese, iron, cobalt, nickel, magnesium and zinc; depositing a thin highly oriented seed layer on the surface of the substrate from one of the first and second molecular beams for initiating growth of the film, and depositing stoichiometrically the source material corresponding to both the first and second molecular beams on the seed layer.

In a still further aspect, the present invention provides procedures for a sol-gel process for the preparation and deposition of ferroelectric fluoride thin films and bulk materials, e.g., powders, by obtaining and mixing metal fluorides by, for example, reacting metalorganic compounds with liquid hydrogen fluoride to form the metal fluorides $BaF_2$ and $MF_2$. The ferroelectric fluoride can be formed by reacting a mixture of metalorganic compounds in solution with liquid HF or by mixing the $BaF_2$ and $MF_2$ solutions formed by the fluorolysis of the metalorganics.

In still another aspect, the invention comprises a method of depositing a thin film of $Bi_4Ti_3O_{12}$ on a semiconductor substrate, comprising the steps of cleaning the substrate; sputtering on the cleansed substrate temperature in an oxygen free atmosphere that includes argon; a thin dielectric passivating - layer, the substrate having a temperature less than the crystalline growth increasing the temperature of the substrate to the crystalline growth temperature; and sputtering on the passivating layer in an argon-oxygen atmosphere utilizing a target that includes bismuth-oxide for growing the thin film.

The accompanying drawings, which are incorporated in and constitute a part of this specification, illustrate several embodiments of the invention and together with the description serve to explain the principles of the invention.

BRIEF DESCRIPTION OF THE DRAWINGS

FIG. 13(a) is a fragmentary highly magnified schematic plan view of a DRO DRAM memory cell constructed in accordance with the present invention;

FIG. 13(b) is a fragmentary sectional view of FIG. 13(b);

FIG. 14(a) is a schematic diagram of a FEMFET connected as a boot strap capacitor;

FIG. 14(b) is a schematic diagram of an SRAM cell using the capacitor of FIG. 14(a);

FIG. 17 is a schematic representation of apparatus used to practice the method of the present invention;

DESCRIPTION OF PREFERRED EMBODIMENTS

In accordance with the present invention, a non-volatile memory device, comprising a substrate, and a thin film material composed of an isostructural group of fluoride BaMF$_4$ where Ba is barium, F is fluorine, and M is a metal of the group consisting of manganese (Mn), iron (Fe), nickel (Ni) cobalt (Co) magnesium (Mg) and Zinc (Zn). This orthorhombic material (BaMF$_4$) family which are known to be piezoelectric materials, with point group symmetry 2 mm, have also been shown to possess, in bulk single crystalline form, excellent ferroelectric properties. However, we know of no highly oriented thin film of such material in crystalline form prior to the present invention.

Attractive physical characteristics of these materials include good insulators; close structural match of cubic fluorite structure with the zinc blend structure of most compound semiconductors, as well as the diamond structure of group IV semiconductors, a good lattice match with most semiconductors, with exact lattice match being attainable by tailoring alloys, such as Ba$_x$Ca$_{1-x}$F$_2$, low vapor pressure, ionic solids with high free energies of formation and disassociation. Also, the fluorides sublime as molecules, which eliminates the problem of stoichiometry controls during epitaxy.

Figure 6A:
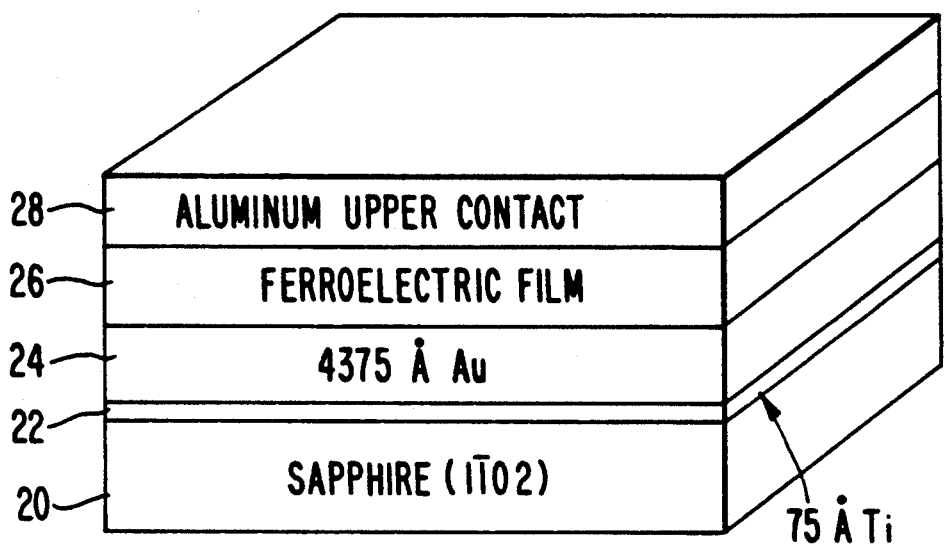
FIG. 6(a) illustrate the structure utilized in obtaining the characteristics of FIGS. 2-5.

In various actual reductions to practice the material BaMgF$_4$ was grown on VLSIC silicon (100) sapphire (1$\bar{1}$02), Cr-Au coated sapphire (1$\bar{1}$02) and highly conductive (0.002 to 0.004Ω-cm) arsenic - doped Si (100) substrates. Referring to FIG. 6(a), the analysis and results set forth hereinafter were conducted using a sapphire substrate 1102 referred to at 20 on which was deposited a film 22 75 Å angstroms of Ti and a film 24 of 4375 Å of AU. A ferroelectric film 26 of BaMgF$_4$ ranged in thickness of from 100 nm to 350 nm depending on the type of analysis. An aluminum upper contact layer 28 overlayed film 26. Hysteresis measurements were performed using a modified well-known Sawyer-Tower bridge utilized to analyze ferroelectric properties of thin films deposited on silicon. For the BaMgF$_4$ thin films grown on highly conducting Si(100), Cr-Au dots 130 mils in diameter were deposited on the film, and back contacts were made through a continuous Al film deposited on the Si surface. In the case of the films grown on sapphire substrates, back contacts were made through a portion of the exposed Cr-Au electrode that was masked during the growth of the BaMgF$_4$ film. The thickness of the Cr-Au electrode was approximately 270 nm. A mercury probe was used for the capacitance-voltage (C-V) hysteresis measurements.

The microstructural analysis of the BaMgF$_4$ films was performed mainly by planar transmission electron microscopy (TEM) and x-ray diffraction techniques. The latter approach employed a thin film x-ray texture camera developed by Wallace and Ward for the examination of thin epitaxial films. For the TEM analysis, the specimens were first mechanically thinned from the substrate side to a final thickness of about 15 microns. The electron-transparent specimens were prepared by Ar ion-milling using a liquid N$_2$ cold stage. The ion-milled specimens were examined in a well-known Philips EM 400T analytical electron microscope equipped with a Link AN10000/LZ-5 EDS analysis system. Initial TEM examination revealed that the BaMgF$_4$ film was not stable under the incident electron beam. Therefore, prolonged exposure of the film to the electron beam was avoided as far as practicable during the analysis.

Figure 1A:
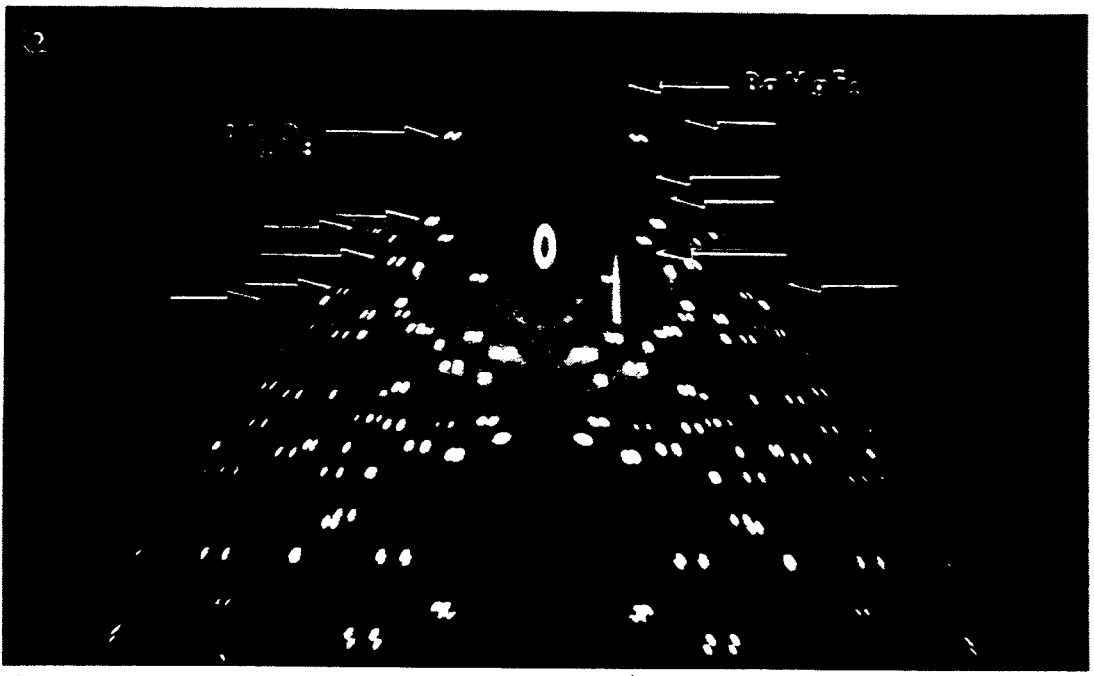
FIG. 1(a)—illustrates a diffraction pattern of $BaMF_4$ grown on sapphire 1102.
Figure 1B:
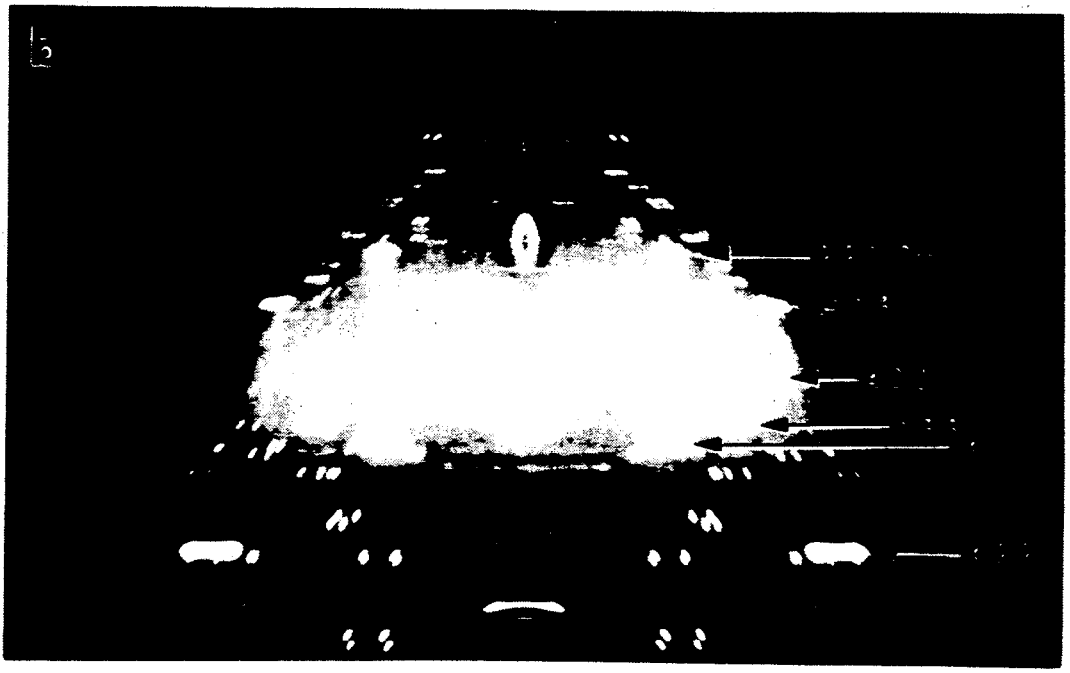
FIG. 1(b)—illustrates a diffraction patterns of $BaMF_4$ film grown on a gold film on sapphire as shown in FIG. 6(a)

In order to interpret the texture camera patterns, twenty-eight values were determined for BaMgF$_4$, and sets of interplanar angles were calculated between the following sets of planes: {100}, {110}, {111}, {120}, {112}, {130}, {113}, {221}, {331}, {123}, and {125}. In the case of BaMgF$_4$/Si(100), the faint, discrete reflections in the texture camera pattern were indicative of some slight degree of preferred orientation in the film. However, lines of uniform intensity at the various twenty-eight values suggested that the film was predominantly randomly oriented and polycrystalline. The BaMgF$_4$ films grown on sapphire (1$\bar{1}$02) were also found to be polycrystalline as shown in the diffraction pattern of FIG. 1(a). However, the films grown on a gold film on sapphire had some degree of preferred orientation, probably [001], with some additional texture components: [211], [021]. The texture camera pattern of this film is shown in FIG. 1(b). The Au substrate layer in this film exhibited a strong [111] texture. On the basis of the results obtained with the x-ray texture camera, the BaMgF$_4$ film grown on the Cr-Au coated sapphire (1$\bar{1}$02) substrate was chosen for further examination with TEM.

Figure 2A:
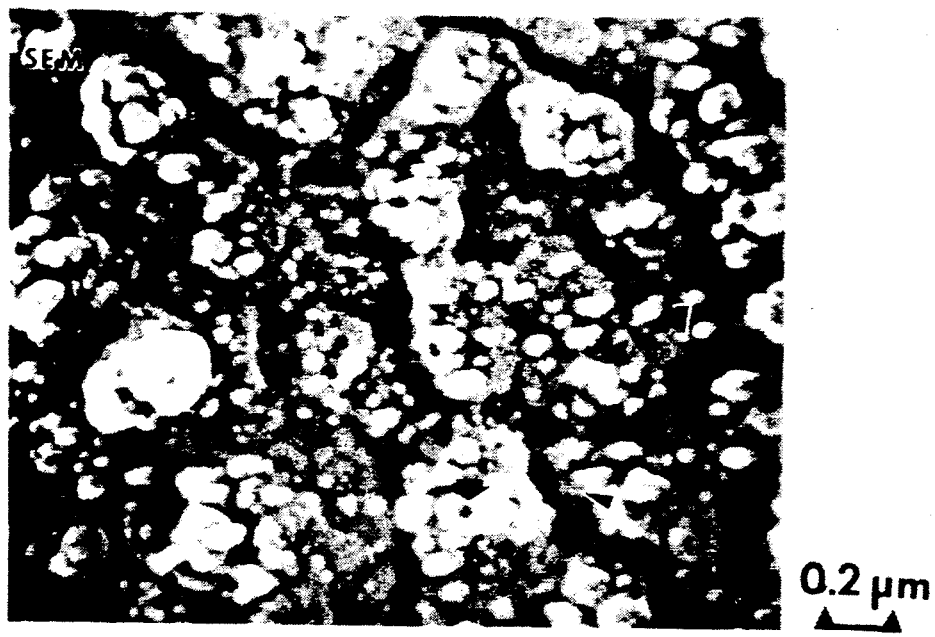
FIG. 2(a) and 2(b) illustrates complementary SEM and STEM micrographs of the film of FIG. 6(a)
Figure 2B:
Figure 3A:
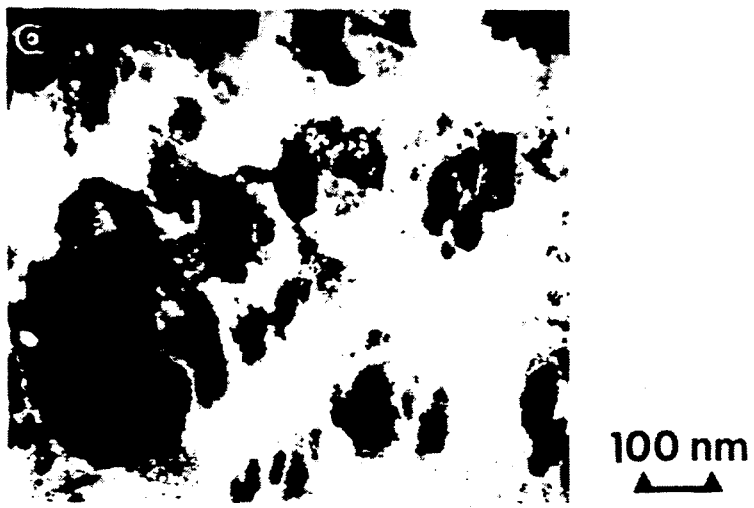
FIG. 3(a) or 3(b) illustrate TEM micrographs of the film of FIG. 6(a)
Figure 3B:
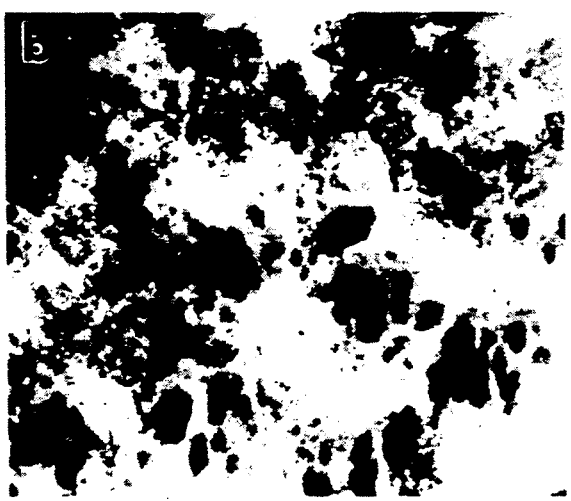
Figure 3C:
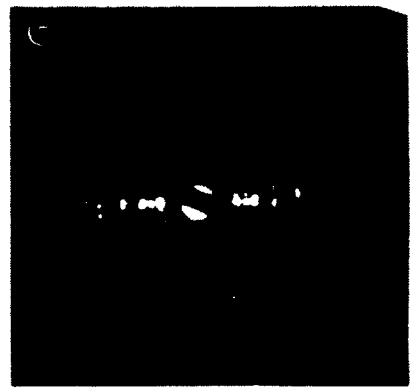
FIG. 3(c) is an electron diffraction pattern.
Figure 4A:
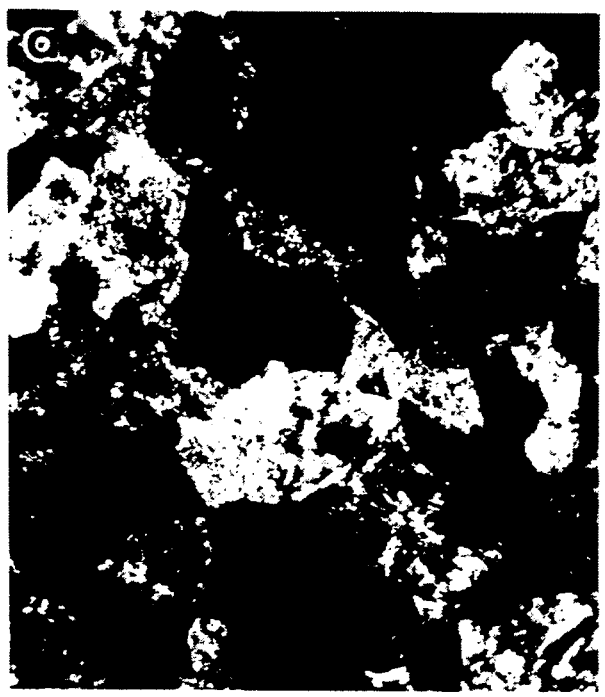
FIG. 4(a)–4(d) are dark field micrographs illustrating fine substructure of grains of the film of FIG. 6(a)
Figure 4B:
Figure 4C:
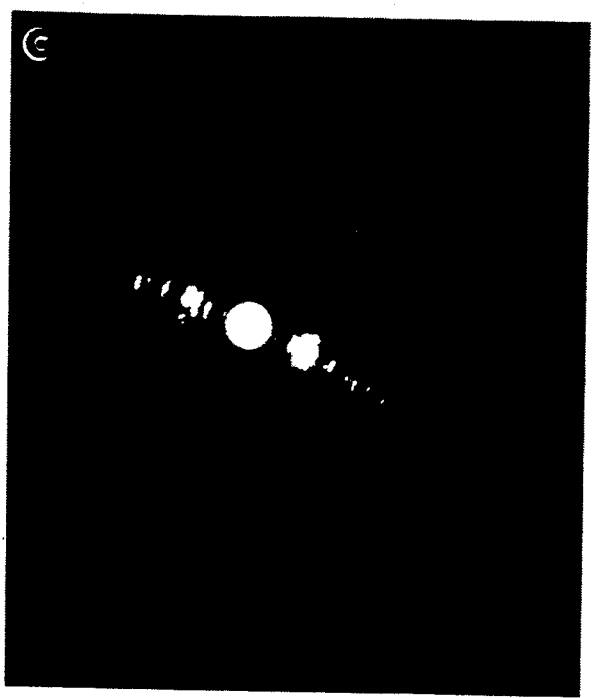
Figure 4D:
Figure 5A:
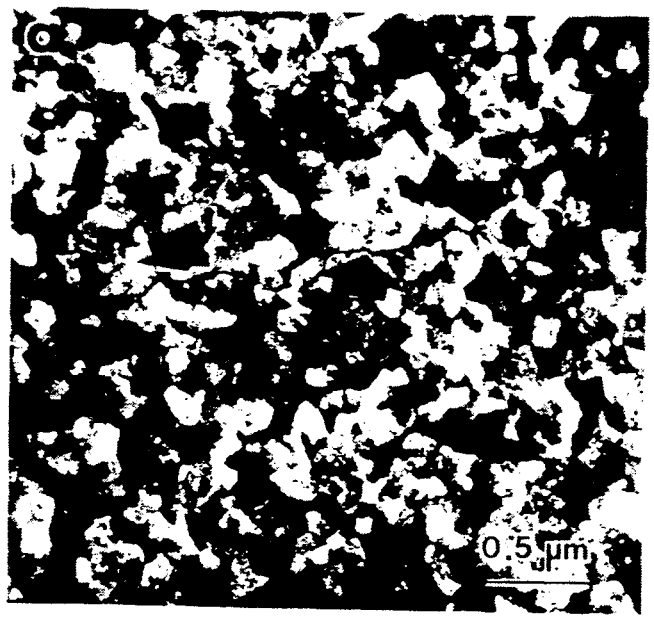
FIG. 5(a) and 5(b) illustrate a typical distribution of grains which share a cystallographic direction.
Figure 5B:
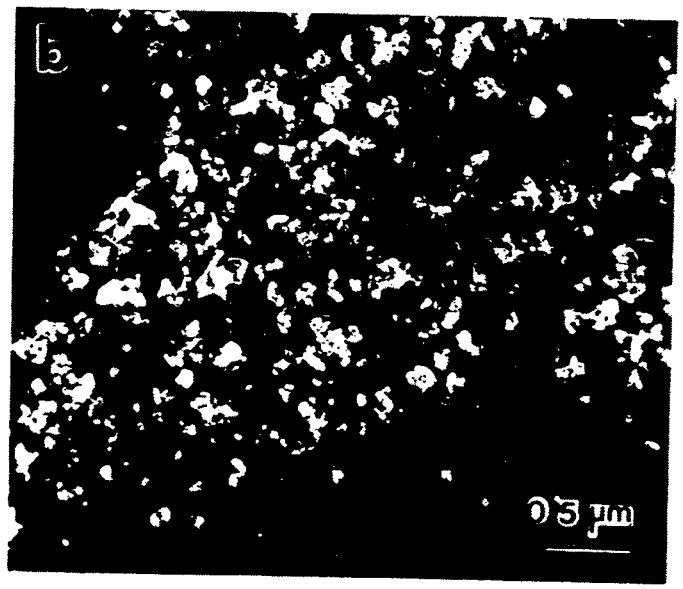

The BaMgF$_4$ surface layer was studied using high resolution SEM, STEM-EDS, TEM, and electron diffraction techniques. The surface morphology of the film was rough with both coarse and fine hillocks. Complementary SEM and STEM micrographs of the film, shown in FIG. 2(a) and 2(b), reveal a variety of microstructural features including very fine (about 20 nm) porosity (SEM: black arrows, STEM: white arrows), and a crack in the film (black and white arrows). The cracks could have been created during the TEM specimen preparation. The film was comprised of very fine polycrystalline regions, as evidenced in the TEM micrographs shown in FIG. 3(a) and 3(b). Selected area electron diffraction and convergent beam electron diffraction patterns confirmed that the film is crystalline, and close to a major orientation. The electron diffraction pattern in FIG. 3(c) shows that the there is a preferred direction within the plane of the film. The structure of the film as revealed from centered dark field micrographs provided additional information concerning the fine substructure of the grains, and the general distribution of grains sharing a common direction. The very fine substructure of grains is visible in the centered dark-field micrographs of FIG. 4(a), 4(b), and 4(c). The brightly imaging grains in FIG. 5a, 5(b) and 5(c) indicate the typical distribution of grains which share a common crystallographic direction.

To supplement the microstructural observations, energy dispersive x-ray microanalysis (EDS) was performed on various regions of this specimen to confirm the chemistry of the film. The spectrum showed the presence of Au in addition to Ba, Mg, and F, as expected, due to the gold substrate film. Some copper was also detected, and was attributed to fluorescence in the microscope. No attempt was made to perform a quantitative analysis of the film composition, because of the uncertainties in the EDS calibration for low atomic number elements, and also because of the common phenomenon of the partial decomposition of fluorides by electrons during the analysis.

Figure 6B:
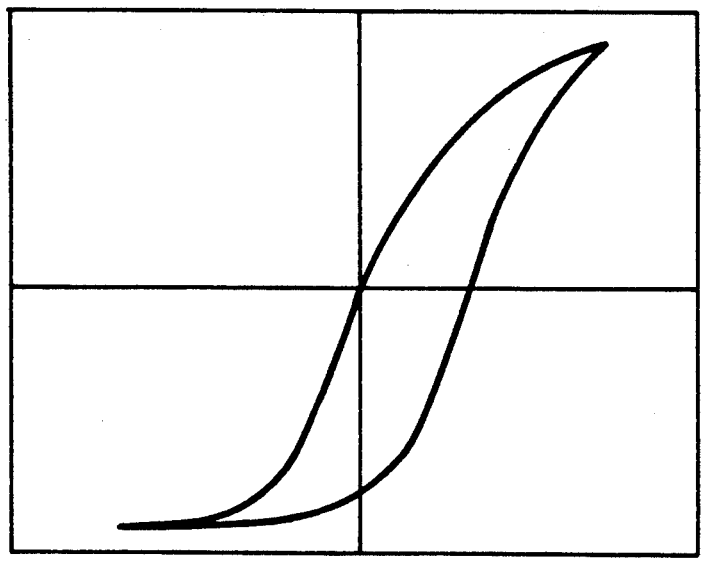
FIG. 6(b) is the hystereses loop of FIG. 6(a)

A typical hysteresis plot of a 472 nm thick BaMgF$_4$ film grown on a Cr-Au coated sapphire (1$\bar{1}$02) substrate at 500° C., is shown in FIG. 6(b). The hysteresis loop is off-centered, probably because of the effect of the dissimilar electrodes, and also due to stress caused by the difference in thermal expansion coefficients of the substrate and the film. The spontaneous polarization of this film, measured at a higher voltage just prior to breakdown, was found to be close to 1.0 μC/cm, significantly less than the bulk value of 7.7 μC/cm reported for the [100] polar axis. Similar plots were also obtained with films grown on heavily As-doped silicon (100) substrates. One important reason for the discrepancy in the polarization values is that the BaMgF$_4$ thin film did not have the optimum polar-axis orientation, and thus the measurements were not performed along the polarization axis. Also, impurities were incorporated in the film due to non-ideal starting materials. The coercive form in this film was calculated to be 160 kV/EM.

Figure 7:
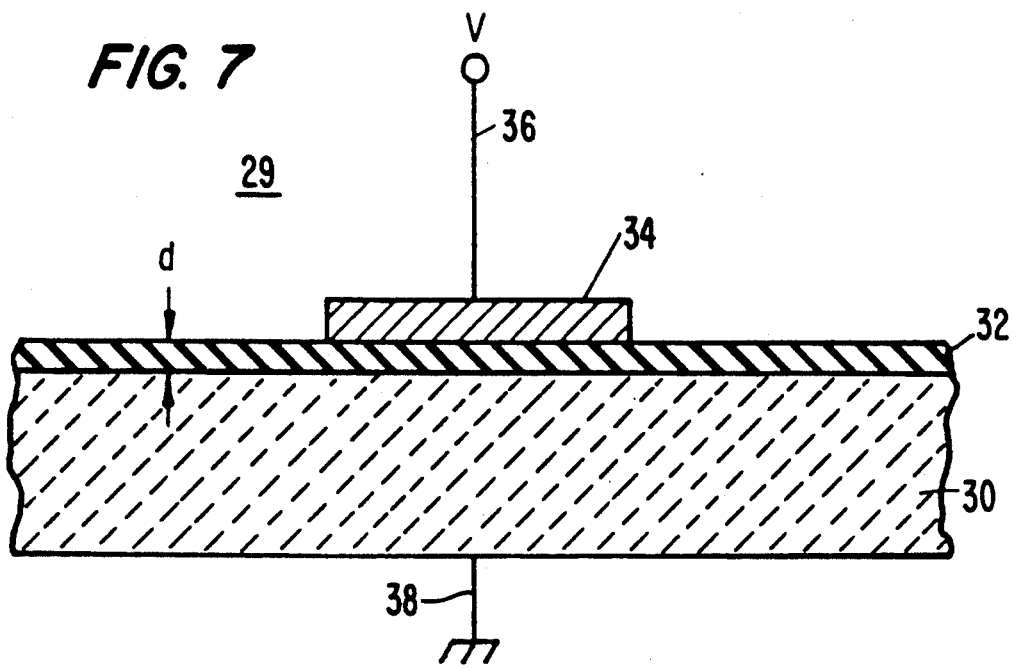
FIG. 7 is a representation of an MIS diode incorporating a thin film of the present invention.

Referring to FIG. 7, a metal-insulator-semiconductor (MIS) device 29 is shown having a substrate 30, which may be silicon or gallium arsenide, for example, a thin film of BaMgF$_4$ referred to at 32, and a metallic gate structure 34 having a terminal 36. A ground connector 38 is in ohmic contact with substrate 30.

Conductor (metal)-insulator-semiconductor (MIS) device 29, such as, shown in FIG. 7 is a useful tool for the development of semiconductor integrated circuits. Since the reliability and stability of all semiconductor devices ar intimately related to their surface conditions, an understanding of the surface physics with the help of MIS devices is very important during device development. MIS structure 29 of FIG. 7 has d as the thickness of insulator, 32 and V as the applied voltage of conductive plate 34. This convention is used wherein the voltage V is positive when conductive plate 34 is positively biased relative to semiconductor body 30 via ohmic contact 38, and conversely. The total capacitance C of the series combination of the insulator capacitance $C_i$ ($=\epsilon_i/d$) and the semiconductor depletion-layer capacitance $C_D$ is:

$$C = \frac{C_i C_D}{C_i + C_D}$$

For a given insulator thickness d, the value of $C_i$ is constant and corresponds to the maximum capacitance of the series combination.

Figure 8:
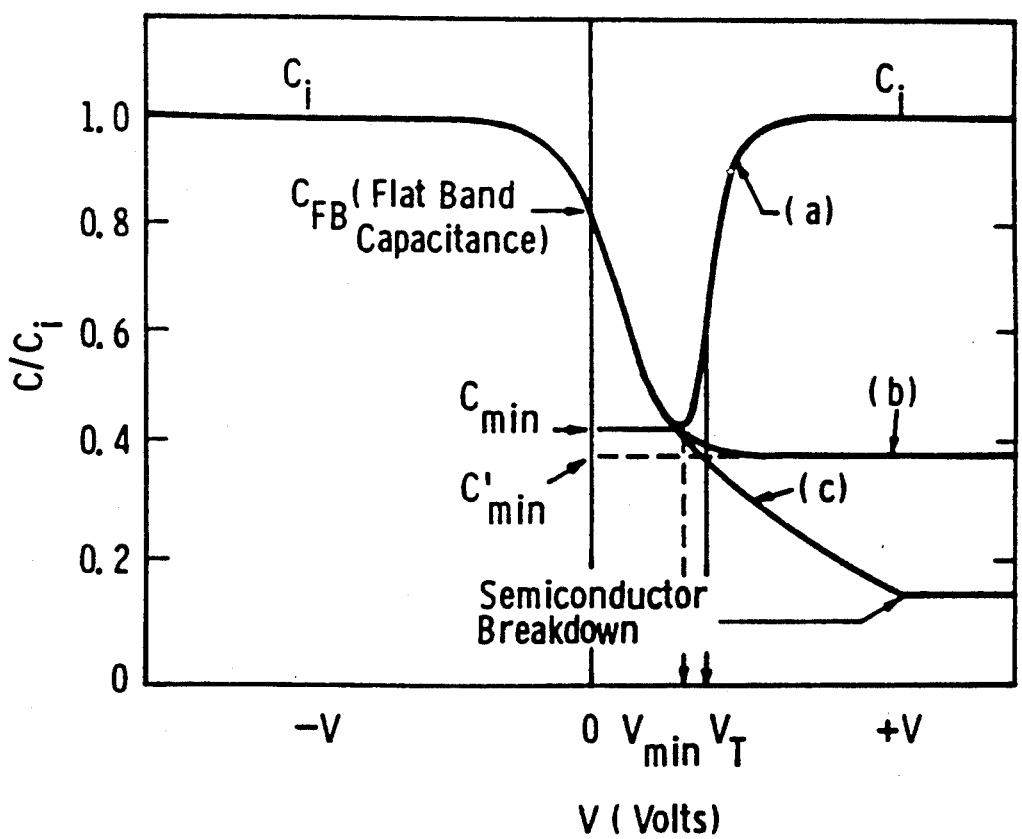
FIG. 8 is a graphical representation of MIS voltage capacitance curves at (a) low frequency, (b) high frequency, and (c) deep depletion.
Figure 9A:
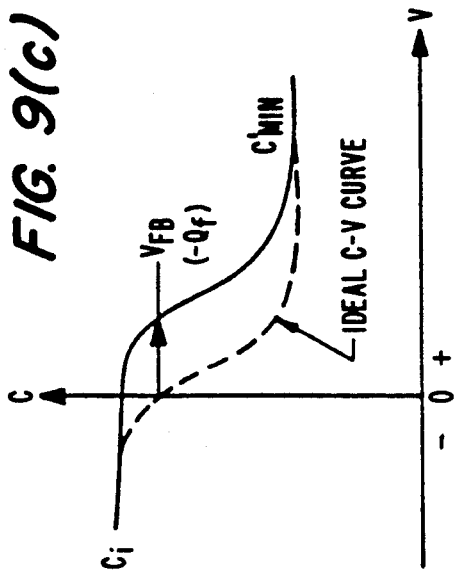
FIG. 9(a)–9(d) illustrates C-V curve shift along the voltage axis due to positive and negative field oxide charge.
Figure 9C:
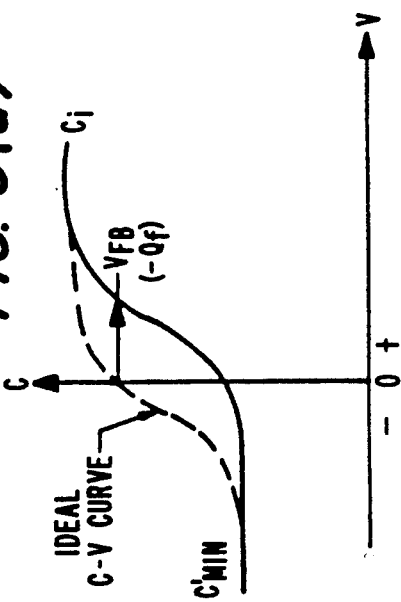
Figure 9B:
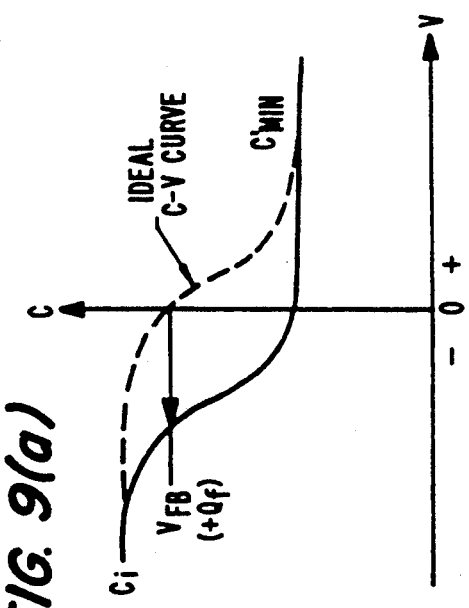
Figure 9D:
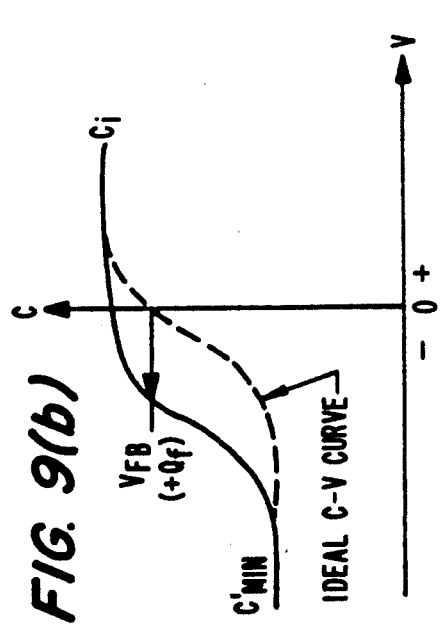

FIG. 8 illustrates typical behavior for N-channel devices with a p-type body. Where the gate is negative relative to the p-type body, there is an accumulation of holes and thus a high differential capacitance for the semiconductor. As the negative voltage is reduced sufficiently, a depletion region which acts as a dielectric in series with the insulator is formed near the semiconductor surface, and the total capacitance decreases. For cases where the mobile electrons are able to follow an applied ac signal, the combined series capacitance goes through a minimum, and then increases again as the inversion layer of electrons forms at the surface. Note that this increase of capacitance only happens at the very low frequencies where the recombination-generation rates of minority carriers (electrons, in our example) can keep up with the small signal variation and led to charge exchange with the inversion layer in step with the measurement signal. Consequently, for higher frequencies, MIS curves do not show the increase of capacitance as the gate voltage goes positive relative to the p-body, as in curve (b) of FIG. 8. For deep depletion conditions, usually associated with pulse operation as in a CCD for example, curve (c) of FIG. 8 shows an even further reduction of capacitance due to a greater depletion depth.

Figure 10:
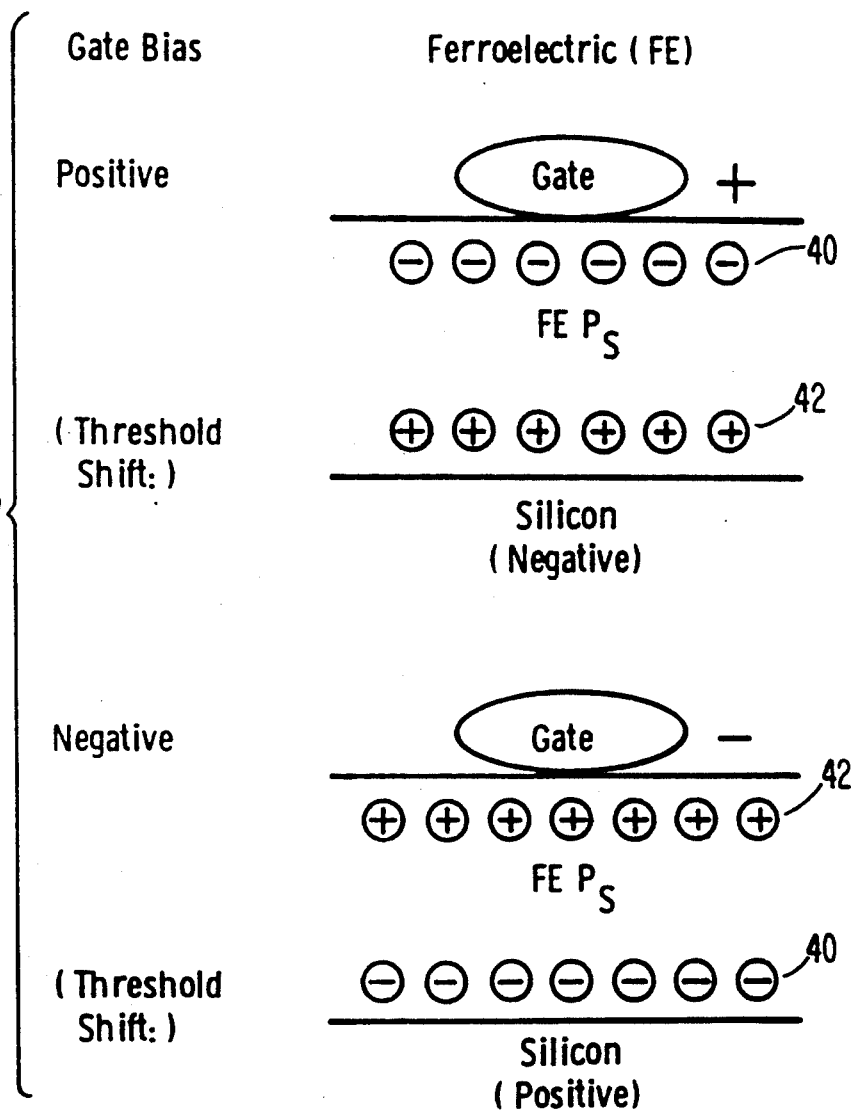
FIG. 10 illustrates the programming of a FEMFET of the present invention.

Various mechanisms operate to provide the equivalent of a sheet of charge in the vicinity of the silicon-dielectric interface. Referring to FIG. 9 (a), the shift is shown along the voltage axis of a high-frequency C-V curve when a positive or negative charge $Q_f$ is present at the interface, measured relative to an ideal C-V curve where $Q_f=0$. A positive $Q_f$ causes the C-V curve to shift toward more negative gate bias values for both n- and p- type transistor bodies, and conversely as shown in 9(a) and 9(b). Identifying the charge $Q_f$ with the effective reversible surface charge of a polarized thin film of ferroelectric material, FIG. 9 directly suggests the programming method for a ferroelectric memory FET (FEMFET), which is illustrated schematically, in FIG. 10, with emphasis on the ferroelectric spontaneous polarization ($P_S$). When gate 34 of FIG. 7 is positive relative to transistor body 30, the reversible ferroelectric spontaneous polarization ($P_S$) switches orientation so that the negative electric dipole charges 40 are adjacent to the positive gate forcing the positive electric dipole charges 42 to be at the silicon interface, and conversely. Switching the ferroelectric dipoles in the gate region of the FEMFET is equivalent to superimposing the right curves 9(a) and 9(b) and left curves 9(c) and 9(d) and as shown in FIG. 11(b).

Figure 11A:
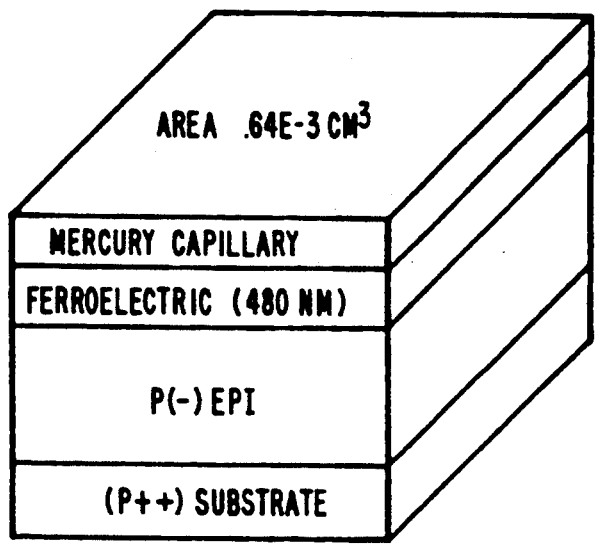
FIG. 11(a) is a structure of the present invention utilizing a silicon substrate.
Figure 11B:
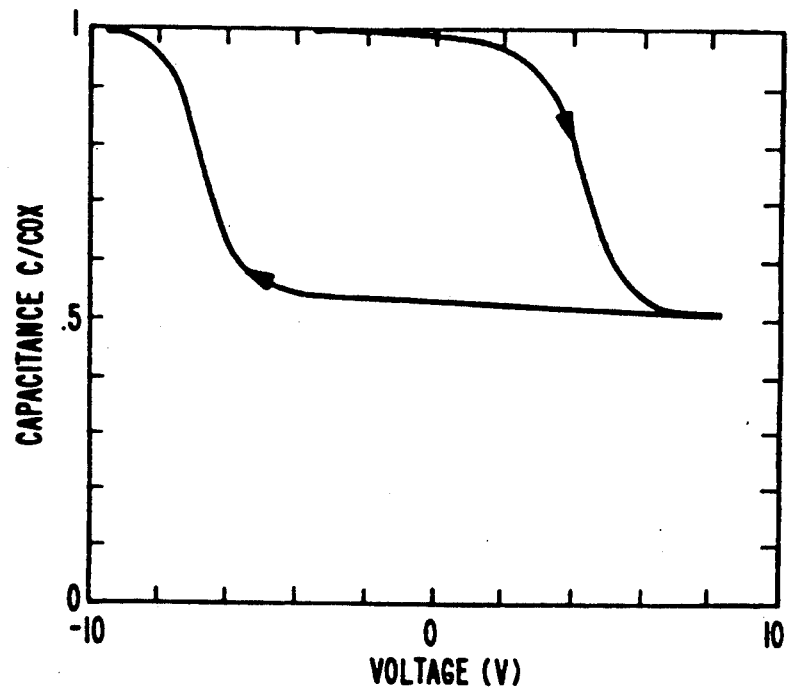
FIG. 11(b) is a C-V hystereses curve of the structure of FIG. 11(a)

A previous investigation of a FEMFET used the test cross-section shown in FIG. 11-a to evaluate the behavior of highly-oriented ferroelectric films on silicon for use in nondestructive readout (NDRO) non-volatile memories. Results typical of unstressed ferroelectric films without any annealing or other processing after film growth, is shown in FIG. 11-b, and incorporates many features of the C-V curves of the preceding description. The most prominent attribute is the 10.8 Volt threshold shift (generally called the "memory window") in response to the ±10 Volt programming. The hysteresis loop was scanned at the rate of 75 mV/sec. at room temperature, with its clockwise trace indicated by arrows. The (−10 V) bias polarizes the ferroelectric film with negative charge near the silicon, turning "off" the associated N-channel MISFET, and conversely. Combining the 10.8 Volt threshold shift with the (maximum) dielectric capacitance and the area of the memory capillary gives a charge change of about $10^{12}$ electrons per square centimeter. Although that charge density of about 0.16 micro-Coulomb per square cm is much smaller than typical ferroelectric spontaneous polarization values, the net effect on the FEMFET is more than adequate for fast-read (50 nsec) non-volatile memories. Also, note that the 10.8 Volt memory window results from the application of ±10 Volt programming bias. The 10 Volt programming shown in FIG. 11(b) derives mainly from the film thickness exceeding 400 nm for an approximate programming field around 250 kV/cm. The FEMFET structure, however, is quite amenable to scaling. That is, a thinner ferroelectric film should allow reducing the programming bias to lower values, like five Volts for ferroelectric films around 200 nm or less in thickness. Finally, in the lower right hand corner of FIG. 11-b, the lower capacitance from the deep depletion is evident, including the even lower capacitance associated with the NMISFET on-state, derived from the dwell time at +10 Volt on the mercury capillary. Because of the scan rate of 75 mV/sec, all of the above results are representative of saturated rather than partial programming that might occur in the case of programming pulses of shorter duration and/or lower fields.

Figure 12A:
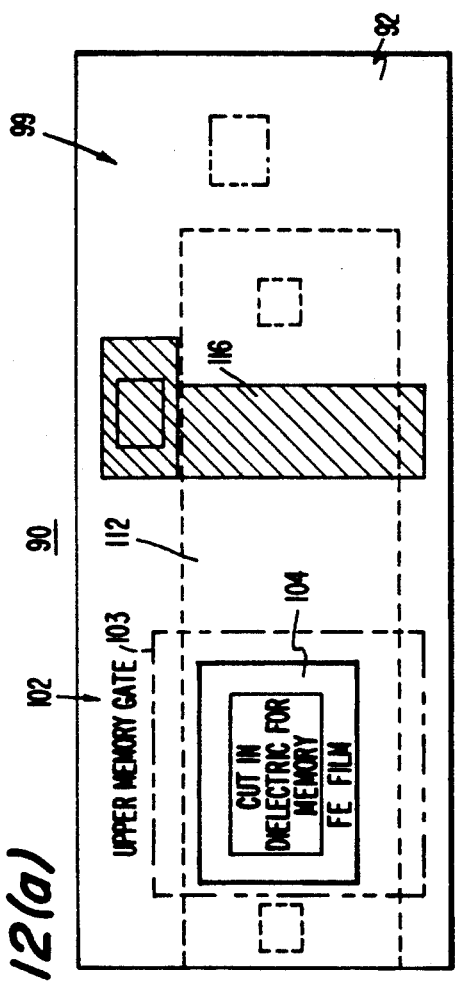
FIG. 12(a) is a fragmentary highly magnified schematic view of a FEMFET NDRO memory cell including an access transistor constructed in accordance with the present invention.
Figure 12B:
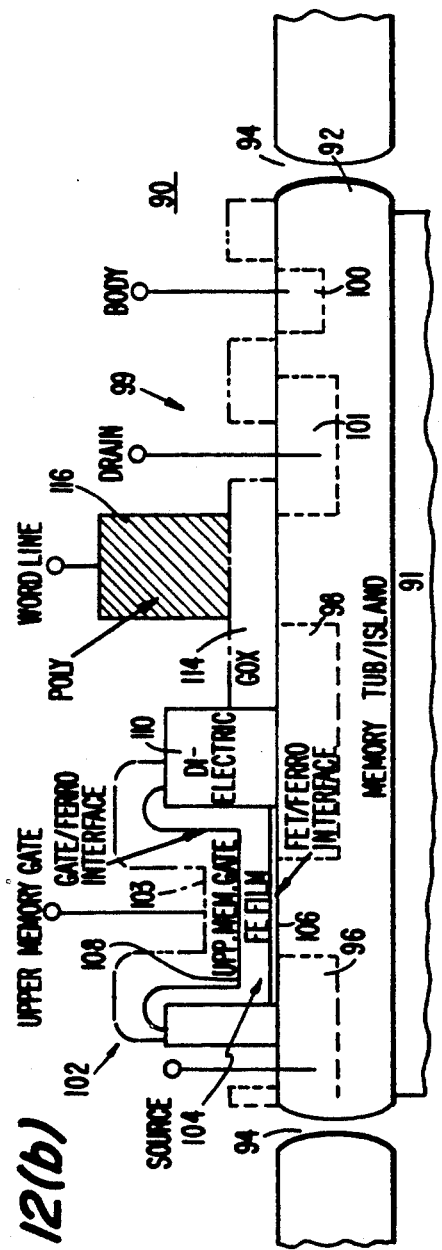
FIG. 12(b) is a fragmentary sectional view of the device of FIG. 12(a)

Referring to FIG. 12(a) and 12(b) a NDRO memory cell 90 comprises a semiconductor substrate 91 which is common to other memory cells of a LSIC. The substrate may be either a semiconductor of the opposite type from island 92 (hereinafter described), or a dielectric, such as silicon on sapphire, for example. Each memory cell 90 has a tub or island layer 92, which is preferably separated from other island layers by a dielectric or junction at 94 in order to provide isolation between storage sites during programming. Each tub or island may be bulk memory or epitaxial layer including a semiconductor on insulator, commonly known as SOI, where SOI may include, for example, silicon on sapphire (SOS), or separation by implanted oxygen (SIMOX), for example.

As embodied herein, SOI or epitaxial layer 92 has a semiconductivity opposite that of substrate 91 in order to provide vertical isolation by means of a reverse bias junction. In order to facilitate programming down to individual bytes or bits, a "picture frame" surrounding the desired cluster of columns uses either dielectric or junction isolation. The need for the isolation of 92 at 94 may be eliminated by utilizing programming circuitry that applies voltages twice that required for programming so as to allow the memory gate to swing plus or minus from the center point of the doubled voltage.

A FEMFET 102, which is built into island 92 is of the opposite type as that of the island. For example, an N channel FEMFET is built into a P type island. As herein embodied, island 92 of the P type has an N type source region 96, a P type body region 92, and a body contact 100. The source region 96 is typically heavily doped, and, if needed for low resistance ohmic contact, region 98 is a heavily doped region. Region 98 serves as a drain for FEMFET 102 and a source for a series access transistor 99. Drain 101 is for transistor 99. Drain 98 may include a less heavily doped portion nearest gate 103, which is sometimes referred to as a lightly doped drain in order to reduce hot election injection and the related deleterious effects. Body contact 100 is a heavily doped region of the same type as island 92 which is used as an ohmic contact to set the bias of the FEMFET body.

In accordance with the present invention, a ferroelectric thin film 104 overlays island 92 and spans source and drain regions 96 and 98. Film 104 is a solid solution of metal halides composed of a mixture of divalent salts deposited on island 92. The mixture is further limited to the type that exhibits ferroelectric hysteresis in the range of about $-55°$ C. to 150 degrees C. In accordance with one embodiment of the invention, the thin film is a compound having the formula $BaMF_4$ where Ba is barium, M is from the group consisting of manganese (Mn), iron (Fe), nickel (Ni), cobolt (Co), magnesium (Mg) and zinc (Zn), and (F) is fluoride, In accordance with another embodiment, the thin film may be bismuth titanate having the formula $Bi_3Ti_4O_{12}$.

A buffer layer 106 is preferably deposited on the surface of island 92 beneath the film 104. Where the thin film is bismuth titanate, and in accordance with the invention, buffer layer 106 of a few Angstroms representing a fraction of the thickness of the thin film minimizes charge tunneling and charge trapping which tends to prematurely age and thus degrade the spontaneous polarization of the thin film. Buffer layer 106 is interpose between island 92 and film 104, as hereinafter discussed.

Where the thin film is $BaMF_4$, buffer layer 106 may be used as a seed layer in effectively growing the thin film.

Irrespective of which thin film mixture is used, buffer layer 106 may function as a transition layer for matching temperature coefficients of expansion and crystallite orientation of reversible polarization, for example. It is pointed out, that a buffer layer may not be necessary for certain applications, such as where the thin film is $BaMgF_4$, for example.

Memory gate 102, which is used for programming and contact during readout, also may have a second buffer layer 108 between gate 102 and thin film 104 which serves as a capping layer. As in the case of buffer layer 106, buffer layer 108 also minimizes charge injection, such as charge tunneling and trapping. Also, buffer layer 108 can function to promote adhesion of memory gate 103 to film 104 as well as reducing exposure of film 104 to humidity or other deleterious ambient conditions. The capping layer may be a metal halide grown in situ, or glass ($SiO_2$), silicon nitride, and other dielectrics commonly used in LSIC technology, for example. Gate 103, which must make reliable intimate electrical contact and good mechanical adhesion to thin film 104, including layers 106 and 108, is preferably platinum. However, other VLSIC compatible materials may be used, such as silicides, polysilicon, tin oxide, titanium nitride, titanium, tungsten, gold, or aluminum, for example.

Dielectric 110 serves to electrically isolate critical nodes of FEMFET to prevent shorting and sneak/parasitic current paths, for example. It may be made of any VLSIC compatible dielectric such as various silicon oxides, and/or silicon nitrides. Transistor channel 112 FIG. 12(a) is defined by contact gate dielectric 110 and/or channel stops or guard barriers for constraining current flow. Gate oxide 114 isolates polysilicon word line 116 from gate 102.

Figure 12C:
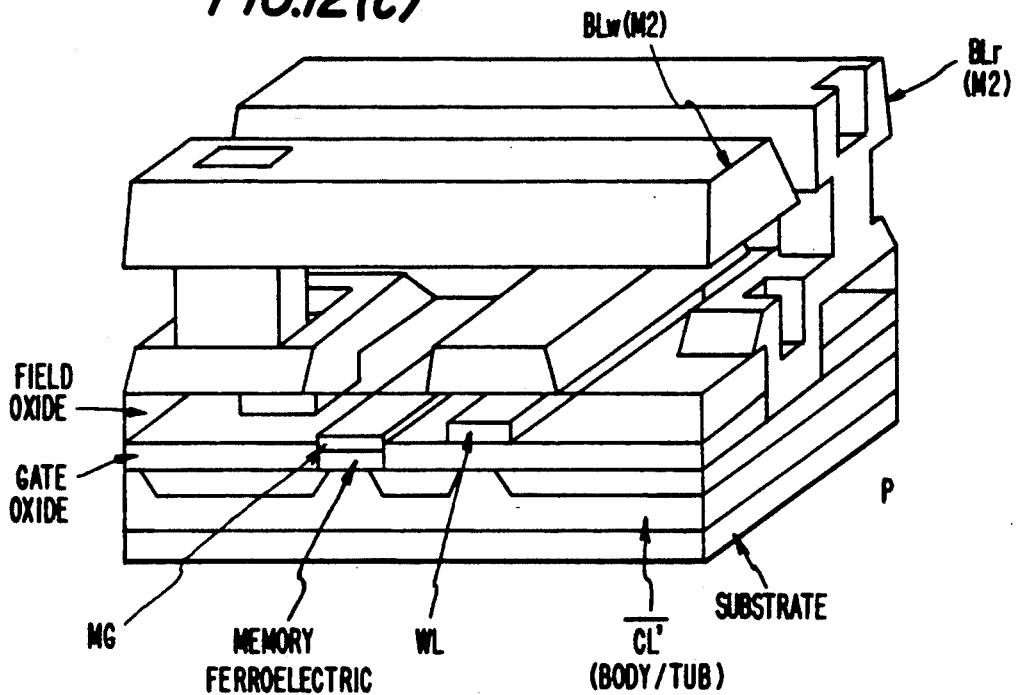
FIG. 12(c) is a three dimensional view of a ferroelectric RAM cell in accordance with the present invention.
Figure 12D:
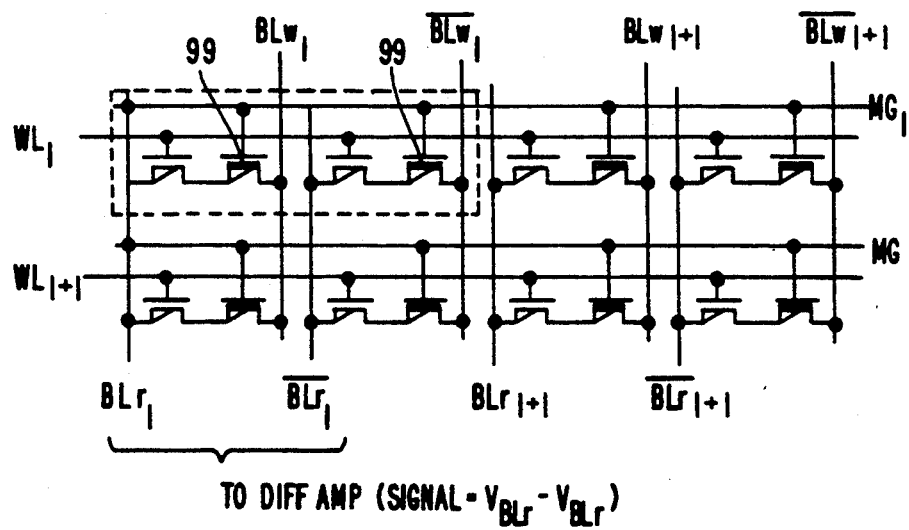
FIG. 12(d) is a schematic diagram of a central memory array using the cell of FIG. 12(a)–(c)

Referring to FIG. 12(c) which shows a three dimensional view of a two transistor ferroelectric random access memory cell, is referred to in describing the connection and operation of the FEMFET memory cell of similar to that of FIGS. 12(a) and 12(b), when connected in a central memory array such as shown in FIG. 12(d). Two FEMFETS 99 per bit are used in a complementary fashion to achieve reliable differential writing and sensing. A metal strap M1 is used on word line WL to reduce delay and improve speeds (see FIG. 12(d)).

Two FEMFET's per bit are used in a complementary fashion to achieve the most reliable differential writing and sensing while one FEMFET per bit can be used for less demanding applications. Included in FIG. 12(c) is a first metal strap which is used on the word line to reduce delay and improve speed. After erase/write, one element is in the depletion mode threshold state ($V_t > 0$ for a p-channel device) and the other is in the enhancement mode threshold state ($V_t < 0$ for a p-channel device).

Figure 12E:
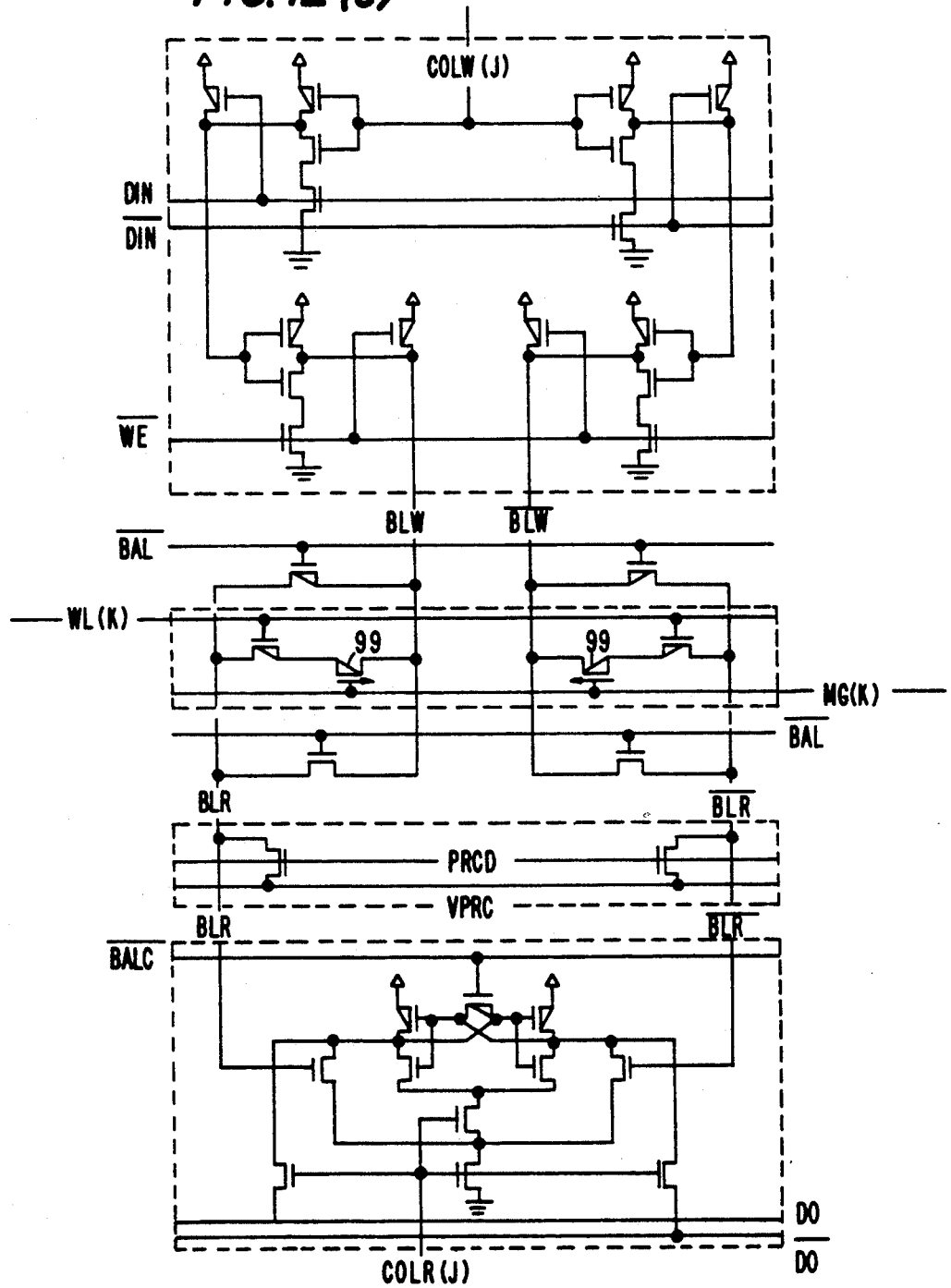
FIG. 12(e) is a schematic diagram of a high speed complementary/differential NDRO sensing scheme in accordance with the present invention.

The differential data storage increases the signal input to the sense amplifier and speeds data detection. FIGS. 12(d) and 12(e) illustrates the differential or complementary NDRO scheme. Typically the nodes used for writing data (BLw and BLwbar) are used as current sources during the Read operation. Only that row in the central memory array activated by the selected word line (WL) can be conductive. Thus, during the Read operation, one of the FEMFET pair will be conducting while the other is nonconducting, by virtue of the opposite or complementary ferroelectric polarization states within the gate dielectric of the two FEMFET's. The complementary column Read nodes (BLr and BLrbar) are precharged to midway between the power supplies so that the one conducting FEMFET pulls its associated sense amp input column toward that power supply attached to the sources of the FEMFET's. The sense amp shown has cascaded stages with negative feedback to rapidly drive the circuit into saturation. SPICE simulations including approximate models for the memory FET's suggest read cycle times in the range of 50 ns to 100 ns.

The differential data storage and sensing of the two FEMFET's per bit cell assures balanced data sensing and minimizes the effects of prompt dose photocurrents which affect both bit lines equally. These cause a common mode voltage which the differential sense amplifier ignores. The two FEMFET's corresponding to a bit are physically adjacent in the array for best matching so that the only difference between them corresponds to the data stored. This scheme also contributes to good operating margins (noise immunity, tolerance to supply variations, etc.) in much the same way as differential data transmission does in differential line drivers and receivers.

FEMFET programming modes are well suited to RAD HARD CMOS process. In typical NDRO EEPROM applications, all the memory transistors reside in a common well. This configuration provides the best density, and easily accommodates bulk erase/write (all words), page erase/write (a group of words), or single word erase/write. Erasure (to an indeterminate state) is done by pulsing the well to the appropriate voltage (0 V for n well) while the memory gates are held at the program voltage, $V_p$ (+5 V for the p-channel case). This places all the selected memory transistors in the same $V_t$ state (non-conducting enhancement mode for a p-channel array). During the write cycle the selected sites are then written with the desired data. In writing the selected word line is pulsed (to 0 V for a p-channel), the well and the bit line are at $V_p$(+5 V for p-channel), and the memory gate is held at ground. This shifts one of the two FEMFET's to the opposite $V_t$ state (conducting depletion mode for the p-channel case while the other inhibits writing by holding the bit line at the memory gate potential ($V_{gs}=0$)).

For writing, the selected row has MG at 0 volts, while the unselected rows have MG at $V_p$. The selected column has data applied in complementary fashion to the $BL_w$ (bit line write) and $BL_w$Bar (bit line write bar) nodes. All unselected columns and one side of the selected column have the source and drain at 0 volts versus $V_p$ for the source/drain of the other side of the selected column. At a selected bit location, one FEMFET structure sees the situation labelled "WRITE INHIBIT."

Page erase (a group of words), single word erase, and byte erase make use of the clear inhibit mode of the FEMFET transistors where the clear is inhibited by holding the gate line of unselected words at 0 volts when the well is pulsed to 0 volts so that $V_g=0$. Cleared words will have $V_{gb}=V_p$.

The following describes the various states of the circuit of FIG. 13(e).

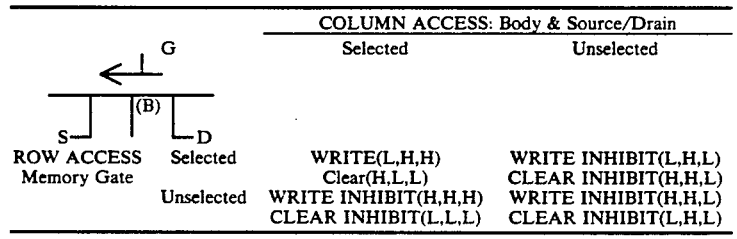

| | COLUMN ACCESS: Body & Source/Drain | |
|---|---|---|
| | Selected | Unselected |
| ROW ACCESS Selected | WRITE(L,H,H) | WRITE INHIBIT(L,H,L) |
| Memory Gate | Clear(H,L,L) | CLEAR INHIBIT(H,H,L) |
| Unselected | WRITE INHIBIT(H,H,H) | WRITE INHIBIT(H,H,L) |
| | CLEAR INHIBIT(L,L,L) | CLEAR INHIBIT(L,H,L) |

BIAS KEY: MODE (VG, VB, VSD) where;
VB = body potential, VG = gate potential, VSD = source & drain potential;
L = low = 0.V = ground.
H = high = +$V_p$ = program voltage In accordance with the present invention, a destructive read-out (DRO) non-volatile memory cell, utilizes a ferroelectric film 104 as described in connection with FIG. 12(a) and FIG. 12(b). As embodied herein and referring to FIG. 13(a) and 13(b), high density DRO memory cell is generally referred to as 120. The memory cell comprises an access FET 122 and a non-volatile ferroelectric capacitor 124. Portions similar to corresponding parts of FIG. 12(a) and 12(b) have similar reference characters.

FET 122 has a semiconductor body 92 which has spaced source and drain regions 128 and 130. A poly gate 126 overlies a gate oxide layer 114, which spans source and drain 128 and 130.

Capacitor 124 is laterally spaced from FET 122 on body 92 with an oxide layer 136 overlaying body 92 and a portion of drain region 130. A lower memory gate 138 overlies oxide layer 136 and the central portion of drain region 130. Lower memory gate 138 may be any of several materials such as platinum, which becomes platinum silicide in a silicon contact window; titanium, or tungsten, for example. Body 92, source 128, and drain 130 may be similar to the corresponding parts of island 92 and source and drain regions 96, 98, and 101 of FIG. 12(a).

A lower buffer layer 106 similar to the like referenced buffer layer of FIG. 12(a) is sandwiched between lower memory gate 138 and thin ferroelectric film 104; and upper buffer layer 108 similar to the like referenced layer of FIG. 12(a) is sandwiched between upper memory gate 140 and thin film 104. For reasons similar to those outlined in connection with the description of FIGS. 12(a) and 12(b).

Ferroelectric capacitor 124 is connected by its lower memory gate 138 to drain 130 of access FET 122, which is of opposite conductivity to body 92. When spontaneous polarization in thin film 104 is reversed, the charge which flows between the source and drain of transistor 122 is the data signal that is read-out destructively. The data signal is sensed through the lower memory gate and programmed by the combined action of the voltages on the two (upper and lower) memory gates.

A ferroelectric capacitor for use in a DRO dynamic ram configuration is similar to the structure of capacitor 124 described in connection with FIG. 13(a) and 13(b) except that in the interest of high density, drain region 130 may be placed directly beneath lower memory gate 138 centrally under film 104 and upper memory gate 140. For such an application, it also may be preferable to eliminate buffer layers 106 and 108.

Additionally, for this application, it is the high dielectric constant of film 104 that is important; rather than the spontaneous polarization. Thus, the bismuth titanite discussed herein as well as BaMF$_4$ may be desirable as the thin film material.

The present invention further includes shadow SRAM cells that includes boot strap capacitors utilizing a ferroelectric thin film composed of a mixture of metal halide salts as herein described. Referring to FIGS. 14(a), a boot strap capacitor 150 is constructed in a manner similar to FEMFET 99 of FIGS. 12(a) and 12(b) with a gate contact 152 and a body contact 154. However, source and drain regions 156 and 158 (S/D) of capacitors 150 are connected. For this application, capacitance between gate 152 and the commonly connected source and drain regions 156 and 158 depends strongly on the polarization state of the thin film schematically referred to in FIG. 14(a) as 160.

When the polarization has been switched to the state where the FEMFET would be non-conductive, the capacitance between 152 and 156, 158 (S/D) is very small; namely, the parallel combination of the gate-to-source capacitance (C$_{gs}$) and the gate-to-drain capacitance (C$_{gd}$). In a self-aligned gate technology, C$_{gs}$ and C$_{gd}$ can be very small because the gate has virtually no overlap over either the source or the drain.

When the polarization has been switched to the state where the FEMFET would be conductive by means of an inversion layer of charge that connects the drain to the source, the gate becomes strongly capacitively coupled to that inversion layer (C$_{ginv}$) and thus also to the (S/D) node. Hence, in the "ON" state, the gate-to-source/drain capacitance becomes (C$_{ginv}$+C$_{gs}$+C$_{gd}$)>>(C$_{gs}$+C$_{gd}$), resulting in that strong dependence of the capacitance on the "data state" (i.e., polarization) of the ferroelectric.

Referring to FIG. 14(b), a shadow-SRAM cell is schematically shown utilizing boot strap capacitors 150. The traditional six transistor (6T) volatile SRAM cell is indicated with a dashed outline (162). To that we add the two ferroelectric non-volatile NDRO boot strap capacitors 150, two "write/read" (W/R) switches 164 and 166 and one "erase" switch 168. To illustrate how the boot strap capacitors 150 operate the operation of the shadow-SRAM is described.

In order to prepare for a random power outage that would otherwise loose all the data in a computer, the non-volatile NDRO shadow portion of the cell is erased by activating the erase switch (E) and driving the pulsed "block" gate low. Together these actions would turn "off" both capacitors 150 into their low capacitance state. This low capacitance state arises from the field applied when the pulsed "block" gate is low and the body goes high. For the illustration of an N-MOS FEMFET, the action of the body going high pulls the floating S/D nodes high and applies essentially full voltage across the ferroelectric.

After this erasing action, the shadow-SRAM operates as a normal (volatile) SRAM until a random circumvention power-down occurs. To achieve fast data capture during power-down, the Write/Read (W/R) switches 164, 166 are activated, erase switch 168 remains disabled, and the gate is driven high. The activation of the W/R switches connects D and $\overline{D}$ to their respective (S/D) nodes on the capacitors 150. Where (D) (and thus (S/D)) and the gate are both high, no field is applied to the ferroelectric film 158, so it remains in the off or low capacitance state. Where (D) (and thus (S/D)) are low while G is high, the low going (S/D) node pulls the floating body (B) low also, and thus applies a field across the ferroelectric film 158 causing it to switch to the on or high capacitance state. The final result is that the two capacitors 150 are written to complementary states.

After system power comes back on, the data previously captured on power-down can be read as follows. The memory chip peripherals activate and insure that the (W/R) switches 164, 166 are on, the pulsed "block" gate is low, and the erase switch 168 is off. Then and only then is the positive voltage applied to the central memory array. As the traditional SRAM cell is activated, the high capacitance of the "ON" capacitor 150 holds that node, ($\overline{D}$), low while the low capacitance of the "OFF" capacitor 150 allows node (D) to swing high much faster. Thus, each SRAM cell is biased by how the boot strap capacitors 150 are written, and rapidly saturates to the proper binary state by virtue of the internal negative feedback. Once the SRAM cell is set, its state tends to reinforce the respective states of capacitors 150; that is, (D) and its (S/D) node are high while gate 152 (FIG. 14(a)) is low tending to turn this capacitor 150 to the low capacitance state. Once restart has been confirmed OK, the shadow portion can be erased to prepare for the next circumvention.

These boot strap capacitors 150 can be grouped in any arrangement desired by the user. Multiple bootstraps 150 can share the same isolation tub/island and pulsed gate and are called a "block". This "block" can be a single bit or a single byte, a Word or Page, or the whole chip. Thus, if the shadow-SRAM were intended to periodically capture data into the ferroelectric shadow, the "block" may be selected to be a word so each new word could be captured uniquely as a word. Conversely, use during random or accidental power-down only suggests a "block" equal to the whole chip to capture all data in about fifty nanoseconds, for example.

The following table indicates operations of the SRAM of FIG. 14(b) for NDRO fast data capture using boot strap capacitors of FIG. 14(a) that are constructed with the ferroelectric thin film of the present invention as described in connection with FIG. 12(a) and 12(b), for example.

Illustrative Shadow-SRAM Operations Using for Non-volatile NDRO Fast Data Capture.

| Shadow Operation | Data (D) | Nodes ($\overline{D}$) | Control (W/R) | Switch (E) | State (Gate) | Resultant BC State (D) | ($\overline{D}$) |
|---|---|---|---|---|---|---|---|
| Erase | High | Low | Off | On | Low | Off | Off |
| Write (for Data Capture) | High | Low | On | Off | High | Off | On |
| Read (at Power-Up) | (After $V_{cc}$ High) High | Low | On | Off | Low | Off | On |
| Idle (Normal SRAM Operation) | X | X | Off | Off | Low | Off | Off |

Figure 15A:
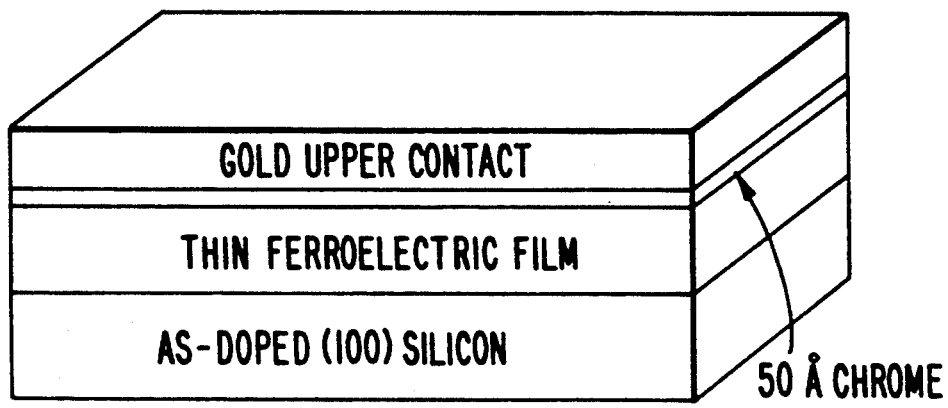
FIG. 15(a) is a sectional view of one embodiment of a semiconductor structure in accordance with the invention.
Figure 15B:
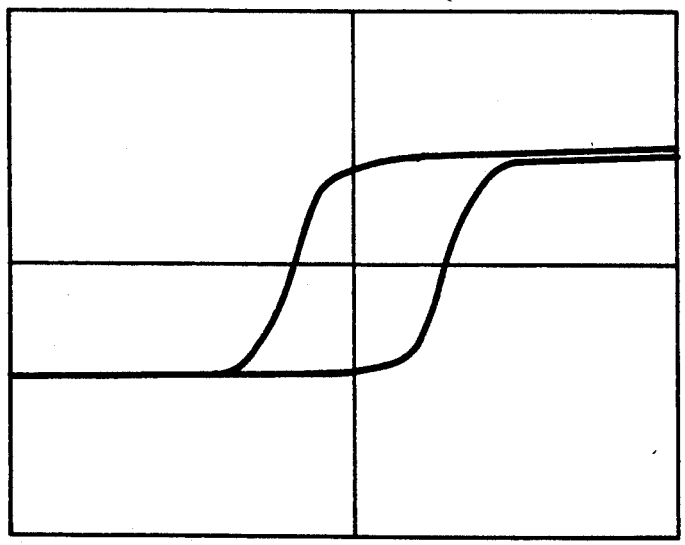
FIG. 15(b) is a graphical representation of a hysteresis loop of FIG. 15(a).

Referring to FIGS. 15(a) and 15(b) in accordance with another reduction to practice semiconductor device was fabricated utilizing an arsenic doped (100) silicon substrate. A thin ferroelectric film of BaMgF$_4$ was deposited directly on the substrate in accordance with the ultra-high vacuum method with the ultra-high vacuum method hereinafter described. A buffer layer of chrome 50 A thick was deposited on the thin film, and a gold contact layer is deposited on the chrome.

The wafer of FIG. 15(a) was 0.8 mm diameter. Preliminary measurements indicated 18UC/CM$^2$ polarization, squareness 0.92 and a breakdown field strength of 8MV/CMV. Referring to FIG. 15(b), the hysteris loop is referenced to a scale having a vertical dimension of 10VC/CM$^2$, a horizontal dimension of $3.87 \times 10^5$V/CM at a frequency of four KHz.

Although all of the devices heretofore described benefit substantially from the highly oriented thin film BaMF$_4$, there are certain applications where one of the devices may be more suitable than others, particularly for non-volatile memories in applications such as VLSIC for example.

Figure 16A:
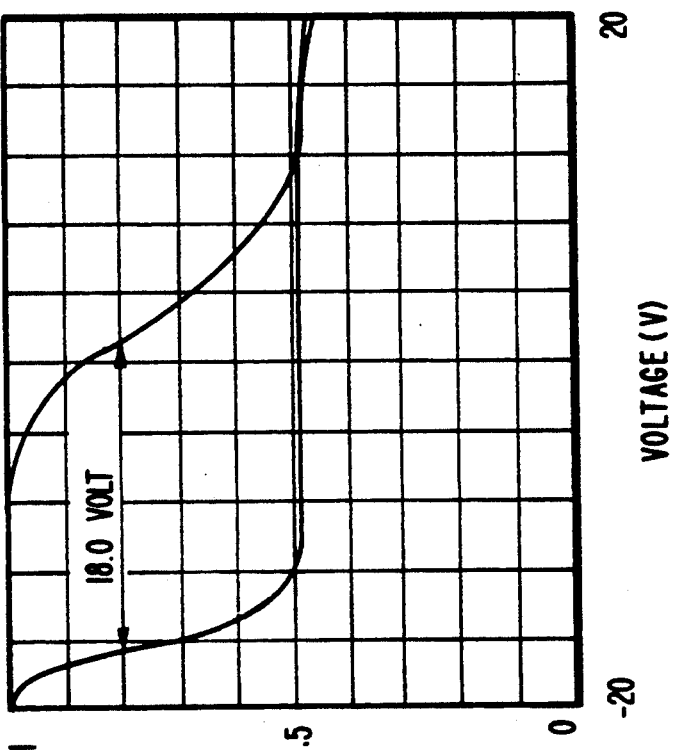
FIG. 16(a) and FIG. 16(b) show C-V hysteresis loops prior to and after switching 13 million cycles of operation of a FEMFET of the present invention.
Figure 16B:
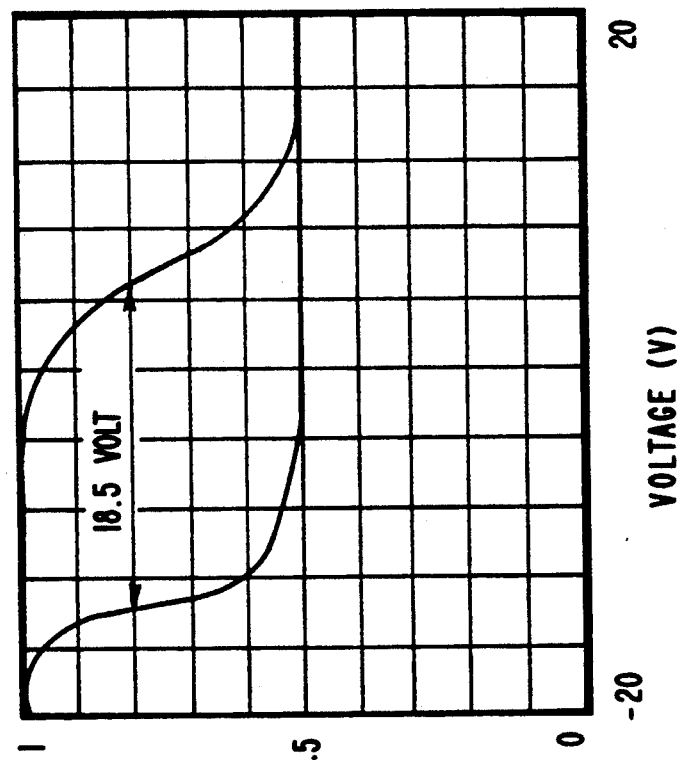

The monolithic FEMFET memory cell concept appears to offer significant potential improvements in operating performance, together with unique nondestructive readout (NDRO) and radiation hard (Rad Hard) characteristics. In accordance with the present invention, FEMFET structures are now grown in which no carrier injection (from the substrate) effects are observed. In these devices, the gate dielectric comprises a thin layer of the ferroelectric fluoride BaMgF$_4$ prepared, in by ultrahigh vacuum (UHV) evaporation. High quality layers of the BaMF$_4$ type fluorides, several of which (M=Mg, Zn, Ni, Co) are ferroelectric, may grow by molecular beam epitaxy (MBE). The C-V measurements on these devices demonstrate that not only can the semiconductor conductivity be modulated directly through polarization reversal in the fluoride film, but also the C-V hysteresis curves show, as shown in FIGS. 16(a) and 16(b) that the saturated memory window is virtually undiminished after more than 13 million switching cycles. FIG. 16(a) illustrates a hystereses curve utilizing a BaMgF$_4$ thin film 480 nm thick on a silicon substrate prior to switching. FIG. 16b illustrates the hysteresis curve after 13 million switching cycles at 60 Hz at 20° C.

An important consideration is the question of destructive (DRO) versus nondestructive read-out (NDRO). The former is conceptually similar to the well known dynamic random access memory (DRAM), wherein the data charge stored in a capacitor is removed and detected in the sensing (readout) operation, then reapplied by appropriate active circuitry for further retention. The NDRO approach is conceptually similar to the static random access memory (SRAM), wherein stored data are read via the appropriate signal currents to the sense amp for very fast readout. Consequently, the DRO capacitor may experience spontaneous polarization, P$_S$, switching during every read operation (because of the rewrite operation); while the NDRO FEMFET is safely protected by having three out of its four nodes grounded during the reading operation and experiences no programming stress across the ferroelectric. These observations have dual implications. The NDRO configuration is likely to experience a longer lifetime before failure in certain applications, given the same ferroelectric mechanization, because the circuit requires much fewer endurance stress cycles. Furthermore, the data in the form the DRO capacitor dwells briefly in active circuitry (not the ferroelectric) that is quite vulnerable to upset by hostile irradiation photocurrents. Consequently, the users of ferroelectric memories should weigh the tradeoffs of the more robust, longer lifetime, faster read cycle, and greater data protection in hostile environments for the NDRO FEMFET versus the higher density and possibly somewhat lower cost for the DRO devices. Other considerations independent of the specific configuration is the programming voltage, V$_p$, very crudely expressed as the product of the dielectric thickness times the coercive electric field. In thin ferroelectric films, there usually is not a unique coercive field, but a broad functional relationship dependent on many variables such as thickness, pulse shape, domain nucleation sites, etc. The programming voltage must also be related to the dielectric breakdown field. The programming field should be low enough that the ferroelectric does not experience accelerated stress during programming. Combining these requirements, it becomes obvious the dielectric breakdown field should be at least one hundred times the coercive field to give some reasonable safety margin on both sides.

Also to be considered is the usable or switchable spontaneous polarization, P$_S$. In the DRO capacitor, this is directly related to the signal charge for the sense amp. Another consideration is intimately related to both of the above; namely, the programming speed by virtue of the question, "How much of the spontaneous polarization P$_S$, is switched by V$_p$, applied for the programming pulse time, T$_p$?"

Another item is the fabrication compatibility needed to incorporate the ferroelectric into the VLSIC or LSIC. The chemical elements of most ferroelectrics can be hazardous contaminants for LSICs if they are not handled properly. Conversely, successful conductive contact to the ferroelectric to form ideal capacitors is often difficult. Insufficiently matched thermal expansion coefficients as well as piezoelectric activity can lead toward cracked or peeling films or contact layers. As hereinafter described, careful control of the layer interfaces as well as the wafer temperature during fabrication should greatly assuage those potential difficulties. A consideration of somewhat lesser importance is the Curie temperature. Here the simplifying assumption is to only work with those materials whose Curie temperature is well above storage and operating range of approximately −55° to 150° C.

Also, the question of the stability of the BaMgF$_4$ and silicon interface is important. Experimental evidence (TEM) confirms the stability of the BaMgF$_4$ and Si interface over a short term. Thermodynamic calculations have now been performed to evaluate the long-term stability of this interface. It has been found that stability is not a problem during the deposition (at 500° C.) or during long-term storage/use.

Considering this chemical system, the only possible reaction is the following:

$$BaMgF_4 + Si = SiF_4 + Mg + Ba.$$

The buried interface is free from external influences, such as oxidation and hydrolysis. Barium and magnesium do form a binary alloy, of which three intermediate phases have been identified. However, it is assumed that the elements are the prime products and the effect of alloy formation is considered later. No actual thermodynamic data is known for BaMgF$_4$, so theoretically BaMgF$_4$ behaves as a mixture of BaF$_2$ and MgF$_2$; thus the reaction becomes:

$$BaF_{2(s)} + MgF_{2(s)} + Si_{(s)} = SiF_{4(g)} + Mg_{(s)} + Ba_{(s)},$$

wherein each component is in its standard state (s: solid, g: gas). The free energy ($\Delta G$) and enthalpy ($\Delta H$) for the reaction are derived from the free energy ($\Delta G_f$) and heat of formation ($\Delta H_f$) respectively for the fluorides, as listed in the following table 1-2, namely:

$$\Delta H = \Delta H_f(SiF_4) - \Delta H_f(BaF_2) - \Delta H_f(MgF_2)$$

$$\Delta G = \Delta G_f(SiF_4) - \Delta G_f(BaF_2) - \Delta G_f(MgF_2).$$

The derived values of $\Delta H$ and $\Delta G$ both at 25° C. and 500° C. are given in the next subsequent table, and the large positive values indicate that the reactants are thermodynamically stable with respect to the formation of the products. For a reaction to proceed, the free energy (and enthalpy) must be at least a negative value. As $\Delta G$ becomes more negative, the position of equilibrium moves further towards the products. However, in this case, the reaction is unfavorable both at room temperature and at 500° C. Even if BaMgF$_4$ is thermodynamically stable with respect to BaF$_2$ and MgF$_2$, and similarly Ba-Mg alloy with respect to its elements, the overall result is not affected. The reactants are stable and there is no driving force to the above reaction.

|          | 25° C. | | 500° C. | |
|----------|--------|--------|--------|--------|
| Compound | $\Delta H_f$ | $\Delta G_f$ | $\Delta H_f$ | $\Delta G_f$ |
| BaF$_{2(s)}$ | −289 | −272 | −288 | −257 |
| MgF$_{2(s)}$ | −268 | −256 | −267 | −235 |
| SiF$_{4(g)}$ | −386 | −375 | −386 | +358 |

| Enthalpy and Free Energy at 25°C. and 500° C. (Values in kcal mole$^{-1}$) | | |
|----------|--------|--------|
| Function | 25° C. | 500° C. |
| $\Delta H$ | +171 | +169 |
| $\Delta G$ | +153 | −134 |

Finally a most important critical issue of great concern for some applications, fearing behavior like the very water-soluble KNO$_3$, namely the susceptibility of the ferroelectric fluorides to dissolve in water. A minimal sensitivity to water has been exhibited that is so weak as to require only mild precautions in design, layout, and fabrication. For example, a ferroelectric fluoride film on a standard VHSIC wafer lay unprotected in a ambient office humidity for a number of weeks without changing the memory window of 12 V. Then the ferroelectric fluoride was immersed fully exposed to running deionized water for 1 minute. Only then did the memory window drop from 12 volts to 9 volts. This result shows that only the gross mishandling of the wafers with the thin film of the present invention can have a measurable effect on the memory device. Since the ferroelectric film is followed immediately by a capping layer and the memory gate (electrode), it becomes completely encapsulated and totally not susceptible to water. The ferroelectric fluoride was then immersed in deionized water stirred violently by nitrogen gas bubbles. Even though there were visible traces of the fluoride film left on the VHSIC wafer, no C-V curves could be obtained, as if the film had been completely removed. Apparently, the fluoride film was gradually dissolved by the deionized water presumably its thickness decreasing monotonically to zero. Such a hypothesis generally indicates the feasibility of scaling dimensions and programming voltages to lower values compatible with VHSIC circuitry. Consequently, the thin film presents only minimal sensitivity to water plus the ability to scale to lower dimensions and voltages.

The thin film of the present invention may be deposited upon a substrate in accordance with modifications of several different method types that can be broadly characterized as (1) molecular beam epitaxy (MBE), chemical vapor deposition (CVD), and Sol-Gel.

With respect to the method broadly characterized as MBE, and in accordance with the present invention. A first molecular beam utilizing a BaF$_2$ source and a second molecular beam utilizing a MF$_2$ source is provided; a thin highly oriented seed layer is deposited on the substrate from one of the first and second beams to initiate growth of the film, and a source material corresponding to that from both the first and second beams is deposited on the seed layer. As embodied herein and referring to the diagram of FIG. 17, a semiconductor substrate, 60 such as silicon is oriented at (100) or (110), for example, with respect to a beam forming means 64. The seed layer may be formed from either beam 62 or 64. Once the buffer or seed layer is deposited, the remainder of the thin film may be either deposited from beam forming means 66 having source material BaMgF$_4$, for example, or the film may be latticed by the alternate application of beams from 62 and 64. A silicon substrate must be pre-cleaned by fairly standard techniques prior to its insertion in an ultra-high vacuum MBE chamber. In the case of a sapphire substrate, the precleaning consists of standard degreasing procedure, a final rinse in deionized water, and then drying in clean, dry nitrogen immediately prior to insertion into the growth chamber. The pressure in the evacuated growth chamber is typically less than 1×10$^{-10}$ Torr. The substrate is then further cleaned in the vacuum chamber by such methods as back sputtering or low-energy ion bombardment. In some special situations where the active VLSI circuitry will not be adversely affected, a high-temperature bake at temperatures ranging from 850° to 950° C. can remove surface oxides or other contaminants. Deposition of the BaMF$_4$ begins by removing a shutter that covers a heated cell such as 66 containing single crystal pieces of the fluoride source material. In the case of the fluoride material, BaMgF$_4$ it was found that, although growth took place at substrate temperatures ranging from 400° to 700° C., the film grown at 450° to 500° C. was of better structural quality than those grown at other temperatures. This range of growth temperature would be similar for other fluorides of this family also. The growth rate, typically 0.1 nm/sec is monitored by a quartz crystal microbalance. It was found that BaMgF$_4$ films with high single crystalline component can be effectively grown on Si(100), sapphire ($1\bar{1}02$) and Cr-Au coated sapphire ($1\bar{1}02$) surfaces. The preferred method for the next fabrication step of a functional device uses a metallization chamber attached to the growth chamber so that the wafer(s) can be transferred under vacuum from the growth chamber into the metallization chamber for contact deposition following the ferroelectric film growth. After depositing a Cr-Au dot pattern on the film surface and Al back contacts on the silicon surface, as hereinbefore mentioned, measurements were performed with a hysteresis bridge. A typical hysteresis plot of a 265 nm thick BaMgF$_4$ film grown on a highly arsenic doped Si(100) substrate in accordance with this present method with a Cr-Au upper contact is similar to that of FIG. 15(a) and 15(b). Thus, the BaMgF$_4$ film possesses excellent ferroelectric properties. Similar results are obtainable with all of the other fluorides of the BaMF$_4$ family. Once a good quality ferroelectric fluoride film is grown on the silicon substrate, all subsequent processing leading to the fabrication of the memory device can be performed using the standard device processing techniques. To develop film structure with a large normal component of polarization, and with low coercive fields, it is vital to control the film orientation and crystallinity. Conditions must be chosen to suppress the natural tendency for the films to grow with a [001] fiber texture, since this results in a minimum value for normal axis polarization. One way of accomplish this is by establishing conditions for epitaxial growth, preferably with the [100] polar axis normal to the substrate, but alternatively with any axis other than [010] or [001]. The lattice parameters for BaMgF$_4$ are a=5.81 Å, b=14.51 Å, and c=4.125 Å. On grounds of symmetry, growth should be attempted on the (110) plane; however (100) wafers are preferred for silicon IC's. This orientation should be considered as an alternative.

In general one of the most effective ways to manipulate the epitaxially growth conditions so as to favor development of an a-axis component perpendicular to the substrate, is to deposit the BaMgF$_4$ using two MBE sources, i.e., BaF$_2$ and MgF$_2$ as previously mentioned. Growth would be initiated from one source first so as to "seed" a very thin highly oriented layer of either the fluoride-type BaF$_2$ or rutile type MgF$_2$ constituent. Since the MgF$_2$ octahedral coordination typical of BaMgF$_4$ replicates most closely that found in the MgF$_2$ tetragonal rutile-type structure, it is probably desirable to begin by depositing a thin seed layer of MgF$_2$. This would then be followed by coincident deposition from the two sources to form the compound, or by fabrication of an epitaxial superlattice comprising thin layers in equimolar proportions. Subsequent interdiffusion either at the growth temperature (400°-500° C.) or somewhat higher would then lead to formation of the stoichiometric compound. Alternatively, the compound layer can be deposited from a single BaMgF$_4$ source, after growth of the seed layer.

An important adjunct to the growth of both the epitaxial seed layer and of the final compound layer is the close monitoring of the epitaxial orientation by use of in-situ electron diffraction. This must be employed at each state of the process, to ensure the orientation and quality of the seed layer, the orientation of the subsequent compound layer, and the effect of thermal annealing in development of the compound from the composite super lattice.

In practicing the method, the fluoride films were grown in a bakeable ultrahigh vacuum (UHV) chamber equipped with a fluoride sublimation source, an ion gun for substrate surface cleaning, an Auger analyzer for the compositional characterization of the substrate and the film, and a low energy electron diffraction (LEED) unit for the determination of the crystallinity of both the substrate and the film. Such a set up has been described previously on the growth of epitaxial group II fluorides on semiconductors. The base pressure in the baked UHV chamber was less than $1.0 \times 10^{-10}$ Torr. The substrates were cut in the form of 0.75 inch square pieces from wafers and mounted on the molecular beam epitaxy (MBE) type sampler holder without indium backing. Bulk single crystal pieces of BaMgF$_4$, Czochraski grown in an isolated growth chamber using optical grade BaF$_2$ and MgF$_2$ as starting materials were used as the source in the evaporator. BaMgF$_4$ films were also grown successfully by evaporation BaF$_2$ (99.995% pure) and MgF$_2$ (99.99% pure) pressed powders, mixed in equi-molecular proportions. Substrate cleaning in the case of Si(100) consisted of chemical cleaning using the known procedure of Ishizaka and Shiraki prior to insertion in the UHV chamber, followed by in situ thermal cleaning at 850° C. for 20 minutes. The silicon surface exhibited the characteristic (2×1) LEED structure and AES examination revealed no detectable contaminants following this procedure. In the case of sapphire ($1\bar{1}02$) substrates, the cleaning procedure preferably consists of standard degreasing in solvents prior to insertion in the UHV chamber, followed by in situ thermal cleaning at 900° C. The sapphire surface exhibited a (1×1) structure following this procedure, and AES revealed that a small amount of carbon contaminant remained on the surface. BaMgF$_4$ films were also grown on Cr-Au coated sapphire($1\bar{1}02$) as well as on highly conducting (0.002 to 0.004 Ω-cm) arsenic-doped Si(100) substrates. These films were to be used for measurements of ferroelectric polarization and switching properties. Growth was carried out initially at several substrate temperatures ranging from 400° to 700° C. Although satisfactory, it is determined on the basis of structural results that the films grown at about 500° C. were of better quality than those grown at other temperatures. Thus, it is preferable that, all BaMgF$_4$ films are grown at 500° C. The growth rate is satisfactorily 0.1 nm/sec.

Another method of depositing the ferroelectric material of the present invention on a substrate, and in accordance with the present invention, comprises a chemical vapor deposition method involving cleaning the substrate, inserting the cleansed substrate into a growth chamber, and the heating the cleansed substrate to a temperature in the range of approximately 450° to 500° C., and subjecting the heated substrate to a volatile metal source and a fluorine source.

Additional precleaning of the substrate is preferably accomplished using a rare gas or hydrogen discharge prior to deposition of the desired film in the growth chamber. In the present invention, the ferroelectric fluoride films are formed using a volatile metal source, such as a β-diketonates, and a fluorine source, such as hydrogen fluoride, fluorine, or fluorine substituents on the β-diketonate. The metal and fluorine source gases are allowed to flow over the heated substrate and either thermal or plasma-assisted decomposition of the gases is utilized to create the reactive species which promote the growth of the desired film. The temperature of the substrate is approximately 400°–450° C. while doing thermal CVD and may be lower for plasma enhanced chemical vapor deposition (PECVD). Fluorinated β-diketonates have been used in a thermal CVD apparatus with Ba as the metal in the molecule. Upon thermal decomposition at atmospheric pressures, the material deposited was found to be $BaF_2$ with some degree of crystallinity. Other metals can be easily incorporated into the β-diketonate structure and used to form alloys of fluorides. Since Ba is a heavy metal relative to Mn, Fe, Co, Mg, Zn or Ni, the β-diketonates incorporating these metals will be more volatile than the Ba analog, and therefore, also suitable for CVD or PECVD. Once a good quality ferroelectric fluoride film is grown on a silicon substrate, all subsequent processing lending to the fabrication of the memory device can be performed using standard device processing techniques.

In the chemical vapor deposition (CVD) method, gases are flowed over a heated substrate and film formation depends on thermal activation of the gases in order to deposit appropriate materials. These temperatures are generally in the range of 500 to 1000 degrees Celsius, and therefore, limits applications. Total gas pressures ranging from atmospheric down to tens of Torr are used. The technique is known for its scalability, purity and high deposition rate. Plasma-enhanced chemical vapor deposition (PECVD) is related to CVD. Under similar total gas pressures and substrate temperatures, PECVD exhibits higher deposition rates than does CVD. With PECVD, activation of the neutral gas species is caused by a gas discharge plasma, usually an rf discharge either inductively or capacitively coupled in a low pressure gas. However, such a discharge can also be dc. These reactive species either react in the gas phase and are transported to the surface, or are absorbed onto the substrate, where the reaction into a solid phase occurs with growth of a film. The purity of the films is a function of the purity of the source gases used, rather than of the vacuum system, because of the high flow rates used in the processing. Due to the rf discharge depositing energy into the gases to cause activation, lower substrate temperatures, in the range of about 25° to 450° C. can be used, but still maintain the advantages of normal CVD approaches. Preferably, the temperature range is in the range of about 300°–450° C. The process can experience high stress films, particulate formation, and low uniformity, but such disadvantages are readily overcome through careful control of process parameters and cleanliness of the reaction chamber. Modulation of the plasma can be beneficial in cases where the compositional uniformity varies across a substrate under continuous plasma depositions.

The crystallinity of insulating films deposited by the CVD type method can be amorphous, polycrystalline, or even epitaxial depending on the deposition conditions. Substrate temperature and deposition rate are two key parameters which influence the crystallinity of the films. Both of these are easily controllable. PECVD generates ions, which depending on the frequency and pressure used, are accelerated across a sheath and can deposit energy into the surface atoms causing adatom motions which lead to enhanced crystallinity at lower temperatures than with thermal CVD.

It is noted in practicing the method of the present invention that the ferroelectric film can be either $BaMgF_4$ or any of the other fluorides of the $BaMF_4$ family described earlier. Also, the substrate can be either uncoated or metal-coated Si, sapphire or gallium arsenide. Plasma cleaning of the substrate can take place in situ, in the same chamber, or in a connected load-locked chamber from which the substrate can be transferred to the growth camber under ultra-high vacuum conditions. The use of metal-organic compounds as the metal sources and fluorinated gases, such as hydrogen fluoride, fluorine, chlorofluorocarbons, can be used as source gases for the film formation. Especially convenient is the use of volatile metal chelates of fluorinated β-diketonates, since both the metal and fluorine atoms are present in the same molecular precursor.

Another embodiment of the present invention relates to the sol-gel process for the preparation and deposition of the ferroelectric fluoride thin films and bulk materials, e.g., powders. Sol-gel processing has been demonstrated as a viable technique for preparing high purity, stoichiometric oxide materials either in thin film or bulk form. The high purity of sol-gel derived materials stems from the ability to purify the organometallic precursors by distillation. Control of stoichiometry results from precise mixing and reaction of organometallic precursors on a molecular level. Sol-gel processing is amenable to the deposition of thin films on virtually any substrate because the precursor liquid is easily applied by dipping, spraying or spinning. These characteristics make the sol-gel process attractive for producing electronic grade bulk materials for targets and for deposition of large area films. Other advantages include the simplicity and reproducibility of the process.

In the process of this embodiment of the invention, the fluorolysis of metalorganic compounds is utilized as a method of thin film or bulk material preparation. The process comprises a method for forming the ferroelectric fluoride of the formula $BaMF_4$ wherein M is a metal ion selected from manganese, iron, cobalt, nickel, magnesium and zinc ions. The method comprises obtaining and mixing the metal fluorides $BaF_2$ and $MF_2$ wherein M is as defined above to form said ferroelectric fluoride. In one embodiment, the metal fluorides $BaF_2$ and $MF_2$ are obtained by reacting a mixture of a metalorganic compound containing barium and a metalorganic compound containing said metal ion M in solution with liquid hydrogen fluoride. In another embodiment, the metal fluorides are obtained by separately reacting a metalorganic compound containing barium and a metalorganic compound containing said metal ion M with liquid hydrogen fluoride to separately from the metal fluorides $BaF_2$ and $MF_2$. Thus, said ferroelectric fluoride $BaMF_4$ can be formed by reacting a mixture of metalorganic compounds in solution with liquid hydrogen fluoride HF or by mixing the individual fluoride solutions of $BaF_2$ and $MF_2$ formed by separate fluorolysis reactions.

Suitable metalorganic compounds include but are not limited to, metal alkoxides, metal β-diketonates and metallocenes containing the desired metal constituents. The sol-gel method represents a low temperature route to the preparation of high purity, stoichiometric ferroelectric fluoride materials and is amenable to the deposition of a thin film on substantially any substrate because the precursor liquid is easily applied to the substrate by dipping, spraying or spinning.

The thin films can be incorporated into various VLSIC's such as nonvolatile memories or integrated high resolution liquid crystal displays. Bulk materials can be used to produce high purity targets for various vacuum, evaporation or sputtering thin film deposition techniques.

In one procedure, a metal alkoxide is reacted with HF to produce the metal fluoride $BaF_2$ and $MF_2$ products. In this process, liquid hydrogen fluoride (not to be confused with aqueous hydrofluoric acid) is treated as the parent compound of an extensive solvent system, analogous to water. Liquid HF resembles water in being substantially a nonconductor of electricity, while dissolving many materials to give conductive solutions. Its dissociation is analogous to that of water as shown by the following equations (1) and (2)

$$2H_2O \rightleftharpoons H_3O^+ + OH^- \quad (1)$$

$$2HF \rightleftharpoons H_2F^+ + F^- \quad (2)$$

In addition, HF can participate in solvation and solvolysis reactions analogous to hydration and hydrolysis as shown below in equation (3). This indicated that fluorolysis could provide a low-temperature route to ferroelectric fluorides, just as hydrolysis is the first step in oxide glass formation.

$$M'(OR)_2 + 2HF \rightarrow M'F_2 + 2ROH \quad (3)$$

In equation (3), R is alkyl, e.g., lower alkyl, and M' is Ba or is a metal as defined above for M.

The highly electronegative character of fluorine leads to predominantly ionic bonding with other elements, and this may promote the formation of the metal-fluorine-metal bridges necessary for polymerization. It is in fact responsible for the very existence of fluoride glasses.

In the aqueous-oxide systems, a wide range of acids is available for peptization. By contrast, if external peptizing agents are necessary in the HF-system, the choice is much more limited. Only those acids which are stronger than HF are candidates, dates, including but not limited to HCl, HBr, HI and $HClO_4$. Even an acid as strong as $HNO_3$ behaves as a base in HF solutions.

Fluorides may also be derived from β-diketonates. These materials may be produced for all of the $BaMF_4$ cations using pure salts as starting materials. They will react with HF, yielding a fluoride product along with recoverable organic species as shown by the following equation (4).

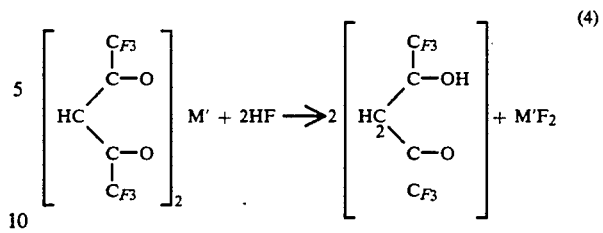

The desired β-diketonates are stable in air and may be reacted with HF at low temperatures either alone or in combination to achieve fluorination.

Fluoride films and bulk materials may also be prepared by the fluorolysis of metallocenes. The metallocenes, which are metal derivatives of cyclopentadiene, have the advantage of being oxygen-free while still reacting at low temperatures with HF to yield a fluoride product.

As in the metal alkoxide embodiment, the ferroelectric fluoride $BaMF_4$ is formed by the reaction of a mixture of β-diketonates or metallocenes in solution with liquid HF or by mixing the $BaF_2$ and $MF_2$ solutions prepared by separate fluorolysis reactions.

For applications where the previously described material $BaMF_4$ may not be desirable, the use of $Bi_4Ti_3O_{12}$ which has been previously proposed for use in storage devices may be considered. Unwanted injection of carriers, and thus aging and degrading may be suppressed growth is performed as provided by a method of the present invention. This comprises cleaning the substrate; sputtering a thin interface buffer layer on the cleansed substrate, the substrate being at a temperature less than the crystalline growth temperature in an oxygen free atmosphere that includes argon; increasing the temperature of the substrate to the crystalline growth temperature, and sputtering the remainder of the buffer and ferroelectric layers in an argon-oxygen atmosphere utilizing a target that includes bismuth oxide for growing the thin film. In the case of $Bi_4Ti_3O_{12}$, optimization of film structures for FEMFETs requires both suppression of unwanted non-ferroelectric insulator phases during growth and development of conditions for epitaxial or highly oriented growth, as well as eliminating the formation of a thin tunneling layer of $SiO_2$.

Figure 18:
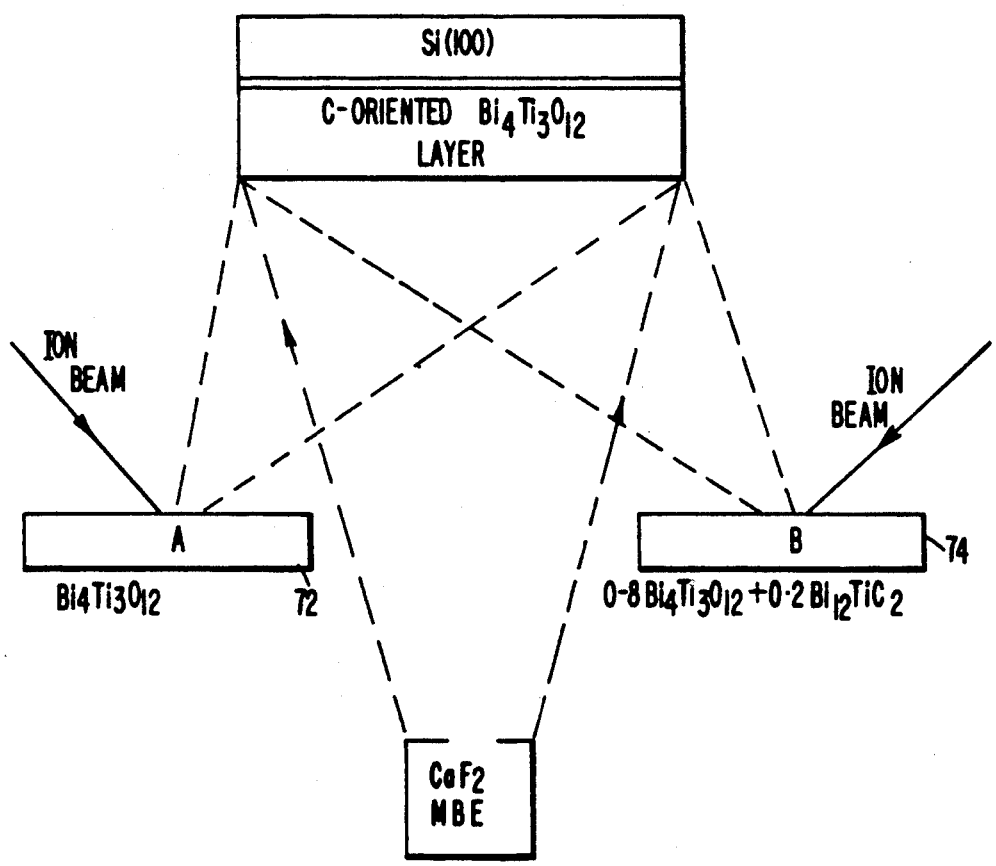
FIG. 18 is a schematic representation of apparatus used in practicing a modification of the method of the present invention.

As embodied herein, and referring to FIG. 18, a silicon (100) substrate is to be covered by a thin film $Bi_4Ti_3O_{12}$. A target 72 of $Bi_4Ti_3O_{12}$ is provided for sputtering at low temperature in an oxygen free argon atmosphere a thin interface buffer layer on the substrate. A target 74 is provided for sputtering at high temperature such as 650° C. for example, a compound of 0.8 $Bi_4Ti_3O_{12}$ + 0.2 $Bi_{12}TiO_2$. Alternately, the buffer layer may be a MBE fluroide such as $CaF_2$ or $BaF_2$.

A primary cause of $SiO_2$ formation (and of derived mixed oxides) at the silicon interface during initial growth of the ferroelectric oxide arises from the need to use partial pressures of oxygen in the sputtering gas, and high substrate temperatures, to ensure formation of the stoichiometric $Bi_4Ti_3O_{12}$ crystalline phase. This effect can be suppressed if, after in-situ cleaning of the silicon, a thin passivating dielectric layer is deposited, prior to high-temperature growth of the c-oriented ferroelectric layer. This layer can be sputtered at lower substrate temperatures using a slightly reducing ambient of argon or argon-hydrogen mixture together with a ceramic target of stoichiometric $Bi_4Ti_3O_{12}$, (see FIG. 18). This would be followed rapidly by growth of the ferroelectric layer at a temperature of about 650° C., using a bismuth-oxide rich target and the usual Ar—$O_2$ ambient. Annealing during the second growth would ensure a homogeneous titanate film structure, but should not promote formation of interdiffused Si—O interface products.

Alternatively, the initial titanate layer could be replaced by a thin epitaxial fluoride such as $BaF_2$ or $CaF_2$, which would serve both to protect and promote growth of the silicon and to promote epitaxy of the final titanate layer. This growth approach would be fully consistent with deposition on (100) substrates which would favor c-axis epitaxy. Solubility of the thin epitaxial fluoride in the titanate should not produce a problem, since fluoride substitution in ferroelectric oxides has in general been found to enhance their dielectric properties.

Finally, enhancement of epitaxial growth could be attained by deposition of one of the constituent metals, preferably titanium or an intermetallic compound in the Bi-Ti system, as a thin epitaxial seed-layer. This would initially protect the silicon surface from ambient oxygen. The metallic layer can then be used for subsequent epitaxial growth of the titanate, after raising the substrate temperature to about 650° C. Admission of the argon-oxygen sputtering gas at this temperature would ensure oriented oxidation of the metal before titanate deposition commences.

In summary, there is provided a sputtering approach involving use of dc, rf, magnetron or ion-beam techniques, as appropriate, using ceramic or metal targets based on the system Bi—Ti—O to allow growth of oriented non-reactive seed layers, followed by oriented $Bi_4Ti_3O_{12}$ deposition on silicon or other appropriate substrates. The initial growth would be performed in a reducing ambient (e.g., Ar—H) to favor epixtaxy on the pre-cleaned Si surface (without the formation of unwanted $SiO_2$-phases) followed by higher temperature growth of the fully crystalline $Bi_4Ti_3O_{12}$ phase. The objective product is a c-axis oriented epitaxial film with low coercive field and free from undesirable non-ferroelectric insulator phases.

The approach described above, and also incorporating an alkaline-fluoride sublimation source ($BaF_2$, etc.) for predeposition of an epitaxial seed layer o the pre-cleaned Si substrate. This layer also acts as an interface buffer, and if thin (approx. 50–100 Å), can be incorporated by annealing into the subsequently grown $Bi_4Ti_3O_{12}$ epi-layer without degrading its properties.

A modification to the above approaches incorporates evaporation or sputtering sources of bismuth and titanium metals, allowing epitaxial deposition of Ti or Bi—Ti intermetallic compound (e.g., tetragonal $BiTi_2$) seed layers, followed by epitaxial oxidation and/or subsequent epitaxial growth of the ferroelectric $Bi_4Ti_3O_{12}$ compound layer.

It will be apparent to those skilled in the art that various modifications and variations can be made to the devices incorporating the thin film material, as well as the material itself, and the methods of depositing such material without departing from the scope or spirit of the invention. Thus, it is intended that the present invention cover the modifications and variations of this invention provided they come within the scope of the appended claims and their equivalents.

We claim:

1. A ferroelectric non-volatile storage device, comprising:

a semiconductor substrate;

a thin film of a ferroelectric solid solution of metal halides composed of a mixture of divalent salts deposited on the substrate, the thin film exhibiting ferroelectric hysteresis in the range of about −55 degrees C. to 150 degrees C.; and means electrically coupled to the thin film and the substrate for applying a predetermined voltage for reversing polarization of the thin film.

2. The storage device of claim 1 further comprising a buffer layer between the thin film and the substrate.

3. The storage device of claim 1 wherein the thin film is composed of a mixture of divalent salts having no oxygen content.

4. The storage device of claim 1 wherein the divalent salts is a compound having the formula $BaMF_4$ where Ba is barium, F is fluoride, and M is selected from the group consisting of manganese (Mn), iron (Fe), nickel (Ni), cobalt (Co), magnesium (Mg), and zinc (Zn).

5. A ferroelectric non-volatile storage device comprising:

a substrate;

a thin film including a compound having the formula $Bi_4Ti_3O_{12}$ exhibiting ferroelectric hysteresis in the temperature range of about −55 degrees C. to 150 degrees C.;

a buffer layer between the thin film and the substrate, and means electrically coupled to the thin film and the substrate for applying a predetermined voltage for reversing polarization of the thin film.

6. The storage device of claim 4 wherein the thin film is composed of a seed layer portion in engagement with a surface of the substrate composed of a source material selected from the group consisting of $Ba_2$ and $MF_2$.

7. The storage device of claim 1 wherein the substrate is composed of material selected from the group consisting of silicon, SOI (semiconductor On Insulator), and gallium arsenide.

8. The storage device of claim 4 wherein the thin film is composed of a seed layer portion of $MF_2$ in engagement with the surface of the substrate.

9. The storage device of claim 4 wherein the thin film is an interdiffused lattice of $BaF_2$ and $MF_2$.

10. The storage device of claim 4 wherein the thin film is coincidentally deposited $BaF_2$ and $MF_2$.

11. The storage device of claim 4 wherein the thin film is a reaction of a metal organic compound containing M and liquid hydrogen fluorine mixed with $BaF_2$.

12. The storage device of claim 11 wherein the metal organic compound is selected from the group consisting of a metal alkoxide, a metal β-diketonate, and a metallocene.

13. The storage device of claim 2, wherein the buffer layer includes $Bi_4Ti_3O_{12}$.

14. The storage device of claim 2 wherein the buffer layer is either $CaF_2$ or $BaF_2$.

15. The storage device of claim 2 wherein the buffer layer is an alkaline-fluoride in the range of about 5–100 Angstroms thick incorporated into the thin film.

16. The storage device of claim 2 wherein the buffer layer is an epitaxial intermetallic compound of either titanium or bismuth-titanium.

17. A ferroelectric non-volatile field effect transistor, comprising:

a semiconductor substrate of one type of conductivity;

spaced regions of the opposite type conductivity formed in a surface of the substrate;

a thin film of a ferroelectric solid solution of metal halides composed of a mixture of divalent salts spanning the space between said regions, the thin film exhibiting ferroelectric hysteresis in the range of about −55 degrees C. to 150 degrees C., and being processable at temperatures non injurious to the substrate and spaced regions, and being disposed without cross contamination between the film and the substrate; and means for establishing a potential across the thin film and the substrate for effecting the spontaneous polarization of the thin film.

18. The device of claim 17 further comprising a first buffer layer between the thin film and the substrate;

a second buffer layer overlaying the thin film; and wherein the potential establishing means includes a conductor overlying the second buffer layer.

19. The device of claim 17 wherein the thin film is composed of a mixture of divalent salts having no oxygen content.

20. The device of claim 17 wherein the mixture of divalent salts is a compound having the formula $BaMF_4$ where Ba is barium, F is fluorine, and M is selected from the group consisting of manganese (Mn), iron (Fe), nickel (Ni), cobalt (Co), magnesium (Mg), and zinc (Zn).

21. A ferroelectric non-volatile field effect transistor, comprising:

a semiconductor substrate of one type of conductivity;

spaced regions of the opposite type conductivity formed in a surface of the substrate;

a thin film of a compound having the formula $Bi_4Ti_3O_{12}$ spanning the space between said regions, the thin film exhibiting ferroelectric hysteresis in the range of about −55 degrees C. to 150 degrees C., and being processable at temperatures non injurious to the substrate and spaced regions, and being disposed without cross contamination between the film and the substrate; and means for establishing a potential across the thin film and the substrate for effecting the spontaneous polarization of the thin film.

22. The device of claim 20 wherein the thin film is composed of a seed layer portion in engagement with a surface of the substrate composed of a source material selected from the group consisting of $Ba_2$ and $MF_2$.

23. The device of claim 17 wherein the substrate is composed of material selected from the group consisting of silicon, semiconductor on insulator (SOI), and gallium arsenide.

24. The device of claim 20 wherein the thin film is composed of a seed layer portion of $MF_2$ in engagement with the surface of the substrate.

25. The device of claim 20 wherein the thin film is an interdiffused lattice of Ba and $MF_2$.

26. The device of claim 20 wherein the thin film is coincidentally deposited Ba and $MF_2$.

27. The device of claim 20 wherein the thin film is a reaction of a metal organic compound containing M and liquid hydrogen fluoride mixed with $BaF_2$.

28. The device of claim 27 wherein the metal organic compound is selected from the group consisting of a metal alkoxide, a metal $\beta$-diketonate, and a metallocene.

29. The device of claim 18 wherein the first buffer layer includes $Bi_4Ti_3O_{12}$.

30. The device of claim 18 wherein the first buffer layer is either $CaF_2$ or $BaF_2$.

31. The device of claim 18 wherein the first buffer layer is an alkaline-fluoride in the range of about 5-100 Angstroms thick incorporated into the thin film.

32. The device of claim 18 wherein the first buffer layer is an epitaxial intermetallic compound of either titanium or bismuth-titanium.

33. The storage device of claim 1 wherein the electrical means include a gate, and further comprises a buffer layer between the thin film and the gate.

34. The storage device of claim 33 further comprising a second buffer layer between the thin film and the substrate.

35. A ferroelectric non-volatile storage device comprising:

a substrate;

a thin film of a ferroelectric solid solution exhibiting ferroelectric hysteresis in the temperature range of about −55 degrees C. to 150 degrees C.;

a buffer layer in the range of approximately 5-100 Angstroms in thickness between the thin film and the substrate; and means electrically coupled to the thin film and the substrate for applying a predetermined voltage for reversing polarization of the thin film.

36. The storage device of claim 35 wherein the substrate comprises sapphire.

37. A ferroelectric non-volatile field effect transistor, comprising:

a semiconductor substrate of one type of conductivity;

spaced regions of the opposite type conductivity formed in a surface of the substrate;

a thin film of a ferroelectric solid solution spanning the space between said regions, the thin film exhibiting ferroelectric hysteresis in the range of about −55 degrees C. to 150 degrees C., and being processable at temperatures non injurious to the substrate and spaced regions, and being disposed without cross contamination between the film and the substrate;

a buffer layer in the range of about 5-100 Angstroms in thickness between the thin film and the substrate; and means for establishing a potential across the thin film and the substrate for effecting the spontaneous polarization of the thin film.

38. The storage device of claim 37 wherein the substrate comprises sapphire.

39. The storage device of claim 5 wherein the buffer layer is an alkaline-fluoride in the range of about 5-100 Angstroms thick incorporated into the thin film.

40. The storage device of claim 35 wherein the buffer layer is an alkaline-fluoride incorporated into the thin film.

41. The storage device of claim 37 wherein the buffer layer is an alkaline-fluoride incorporated into the thin film.

* * * * *

UNITED STATES PATENT AND TRADEMARK OFFICE
CERTIFICATE OF CORRECTION

PATENT NO. : 5,146,299

DATED : September 8, 1992

INVENTOR(S) : LAMPE ET AL.

It is certified that error appears in the above-identified patent and that said Letters Patent is hereby corrected as shown below:

```
Claim 20, column 27, line 24, delete "mixture of";
                      line 28, "(Ni]" should
read --(Ni)--.
```

Signed and Sealed this

Fifth Day of October, 1993

Attest:

BRUCE LEHMAN

*Attesting Officer*      Commissioner of Patents and Trademarks